(12) United States Patent
Karri et al.

(10) Patent No.: US 11,658,573 B2
(45) Date of Patent: May 23, 2023

(54) MODE-TRANSITION ARCHITECTURE FOR BUCK-BOOST CONVERTER

(71) Applicant: Cypress Semiconductor Corporation, San Jose, CA (US)

(72) Inventors: Rajesh Karri, Visakhapatnam (IN); Arun Khamesra, Bangalore (IN); Pulkit Shah, Bangalore (IN); Hariom Rai, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 84 days.

(21) Appl. No.: 17/147,686

(22) Filed: Jan. 13, 2021

(65) Prior Publication Data

US 2022/0069708 A1 Mar. 3, 2022

Related U.S. Application Data

(60) Provisional application No. 63/074,296, filed on Sep. 3, 2020, provisional application No. 63/074,270, filed on Sep. 3, 2020.

(51) Int. Cl.
*H02M 3/158* (2006.01)
*G06F 1/26* (2006.01)
*G01R 19/165* (2006.01)
*H02M 1/00* (2006.01)
*H02M 3/156* (2006.01)

(52) U.S. Cl.
CPC ..... *H02M 3/1582* (2013.01); *G01R 19/16552* (2013.01); *G06F 1/266* (2013.01); *H02M 1/0009* (2021.05); *H02M 1/0025* (2021.05); *H02M 3/1566* (2021.05)

(58) Field of Classification Search
CPC ............. H02M 3/1582; H02M 1/0009; H02M 1/0025; G06F 1/266; G01R 19/16552
See application file for complete search history.

(56) References Cited

U.S. PATENT DOCUMENTS

| | | | |
|---|---|---|---|
| 10,135,340 B1 | 11/2018 | Megaw | |
| 2011/0187336 A1* | 8/2011 | Wu | ............................ G05F 1/10 323/282 |
| 2011/0199062 A1* | 8/2011 | Singnurkar | ......... H02M 3/1582 323/282 |
| 2014/0084882 A1* | 3/2014 | Namekawa | ......... H02M 3/1582 323/271 |

(Continued)

OTHER PUBLICATIONS

USPTO Notice of Allowance for U.S. Appl. No. 17/147,753, dated Aug. 12, 2022, 10 pages.

*Primary Examiner* — Harry R Behm

(57) ABSTRACT

A mode-transition architecture for USB controllers is described herein. In an example embodiment, an integrated circuit (IC) controller includes a controller coupled to a slope compensation circuit, the controller to detect a transition of a buck-boost converter from a first mode having a first duty cycle to a second mode having a second duty cycle that is less or more than the first duty cycle. The controller controls the slope compensation circuit to nullify an error in an output caused by the transition. The controller can cause the slope compensation circuit to apply a charge stored in a capacitor during a first cycle to start a second cycle with a higher voltage than the first cycle.

15 Claims, 22 Drawing Sheets

(56) References Cited

U.S. PATENT DOCUMENTS

| | | | |
|---|---|---|---|
| 2014/0084883 A1* | 3/2014 | Tanabe | H02M 3/1582 323/271 |
| 2015/0256078 A1 | 9/2015 | Tanabe | |
| 2018/0341309 A1* | 11/2018 | Sporck | G06F 13/385 |
| 2020/0244170 A1 | 7/2020 | Chen et al. | |

* cited by examiner

Buck (Vin >> Vout) ; Vout = D*Vin

BB-Buck (Vin ~> Vout) ; Vout = D*Vin/(1-Df)

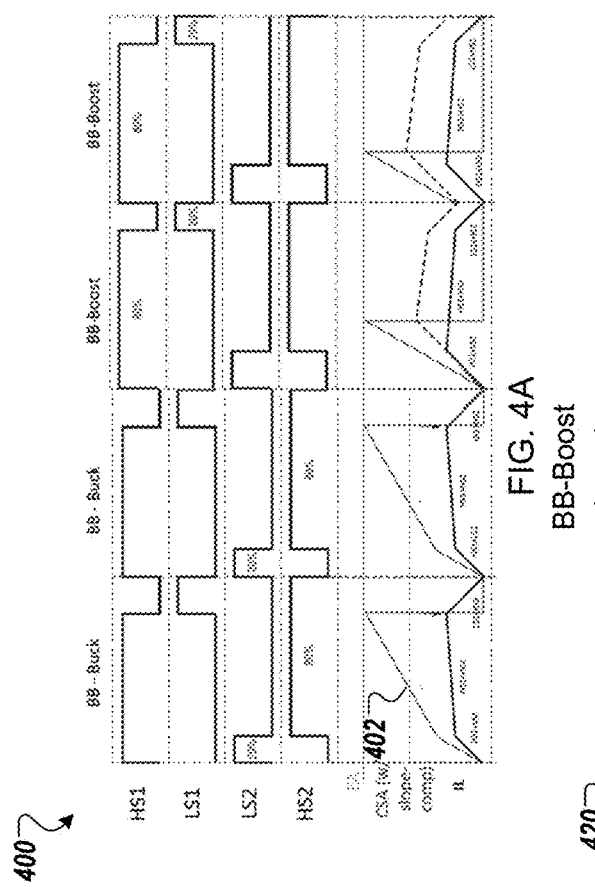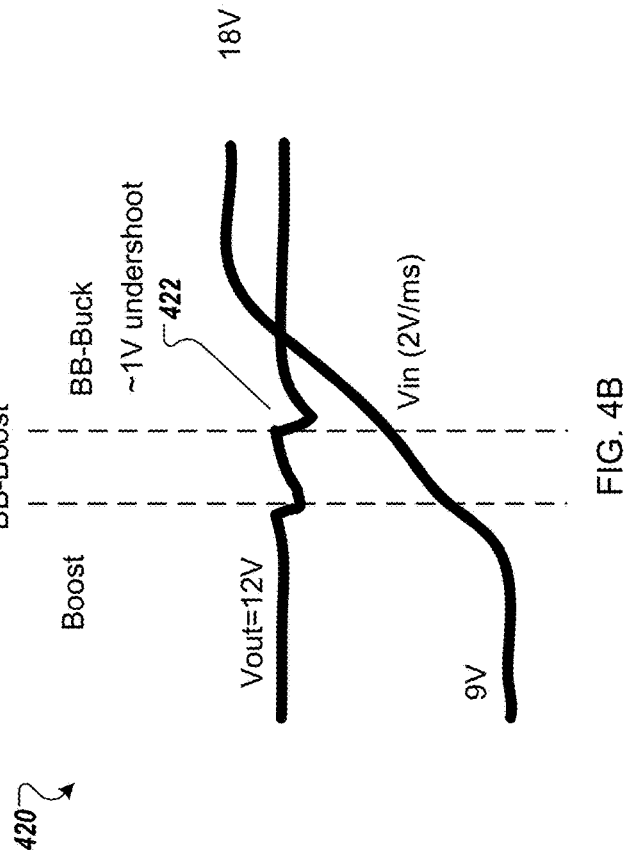

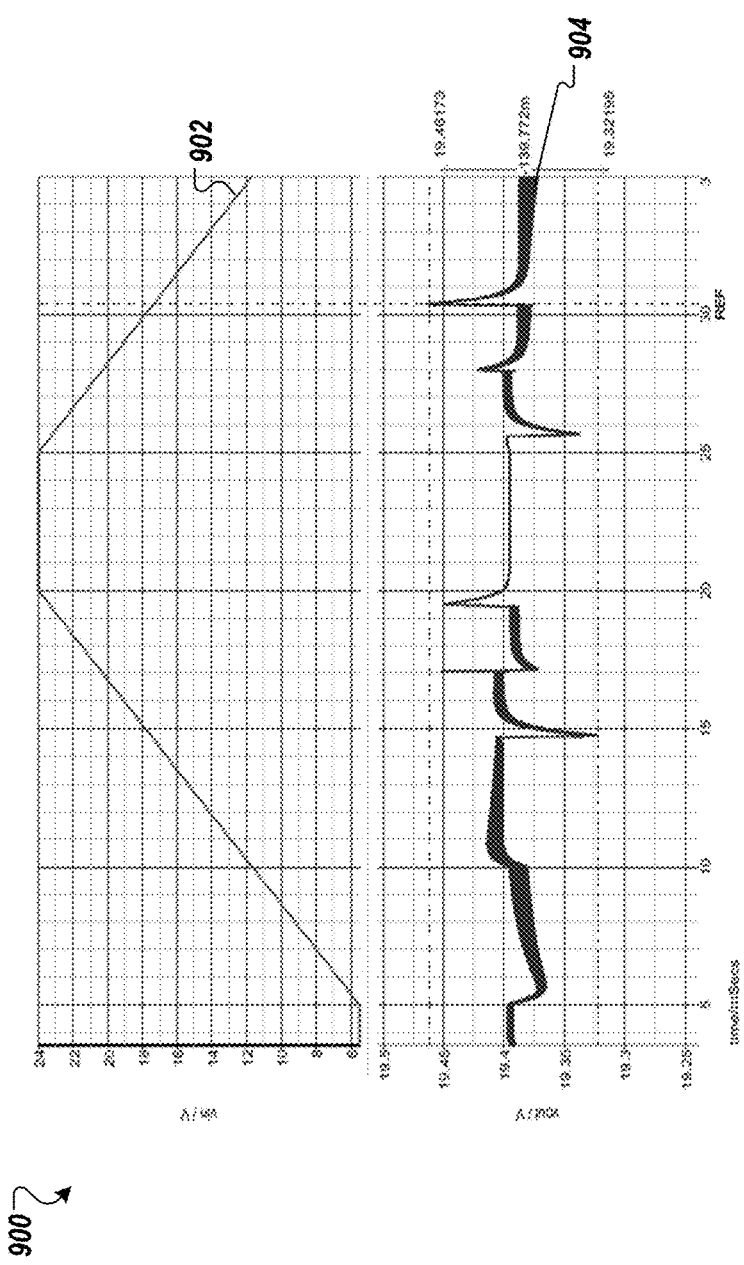
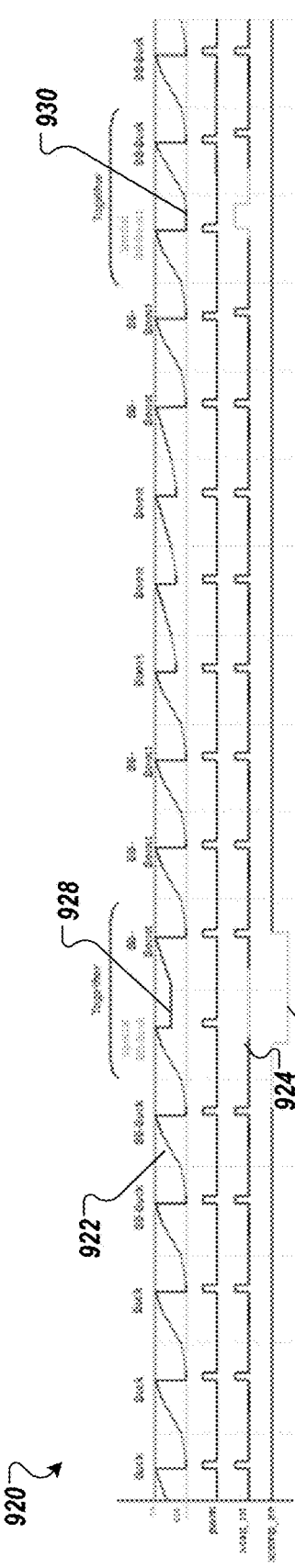
FIG. 9A
FIG. 9B

Slope comp 80% buck, 70% bbbuck, 200% boost, 150% bbboost

Buck/BB-buck Td of 50% of switching cycle; Boost/BB-boost Td of 10% of switching cycle

MODE-TRANSITION ARCHITECTURE FOR BUCK-BOOST CONVERTER

PRIORITY

This application claims the benefit of U.S. Provisional Application No. 63/074,270, filed on Sep. 3, 2020 and U.S. Provisional Application No. 63/074,296, filed on Sep. 3, 2020, the entire contents of both are incorporated by reference herein in their entirety.

TECHNICAL FIELD

This disclosure relates to integrated circuits (ICs) that control Universal Serial Bus (USB) power delivery to electronic devices.

BACKGROUND

Various electronic devices (e.g., such as smartphones, tablets, notebook computers, laptop computers, chargers, adapters, power banks, etc.) are configured to transfer power through USB connectors according to USB power delivery protocols defined in various versions and revisions of the USB Power Delivery (USB-PD) specification. For example, in some applications an electronic device may be configured as a power consumer to receive power through a USB connector (e.g., for battery charging), while in other applications an electronic device may be configured as a power provider to provide power to another device that is connected thereto through a USB connector. In various applications, electronic manufacturers may also use power converters (e.g., such as buck-boost converters) that need to meet various USB-PD specification requirements such as, for example, requirements for output voltage (Vout) monotonicity and stability.

BRIEF DESCRIPTION OF THE DRAWINGS

FIG. 4A is a timing diagram of a slope compensation added to an input current into a buck-boost converter in at least one embodiment.

FIG. 4B is a timing diagram illustrating an undershoot condition on an output voltage (Vout) caused by a slope compensation during a transition from a BB-boost mode to a BB-buck mode in at least one embodiment.

FIG. 9A is a timing diagram of an input voltage (Vin) and an output voltage (Vout) using a slope compensation circuit to nullify an error caused by a transition in at least one embodiment.

FIG. 9B is a timing diagram of control signals to control a slope compensation circuit to nullify an error caused by a transition in at least one embodiment.

DETAILED DESCRIPTION

Figure 1A:
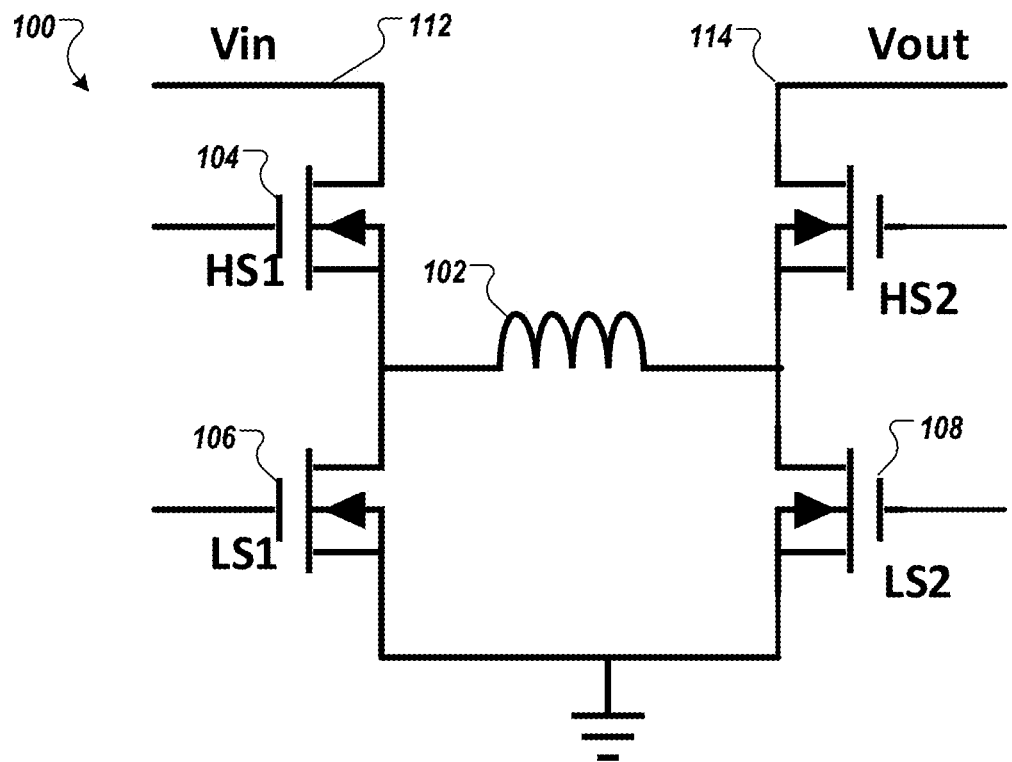
FIG. 1A is a schematic diagram of a buck-boost converter in at least one embodiment.

The following description sets forth numerous specific details such as examples of specific systems, components, methods, and so forth, in order to provide a good understanding of various embodiments of the mode-transition architecture for USB Type-C controllers described herein. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of a mode-transition architecture in USB Type-C controllers that can be disposed to operate in various electronic devices. Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., cables, hubs, docking stations, adapters, chargers, etc.), audio/video/data recording and/or playback devices (e.g., cameras, voice recorders, hand-held scanners, monitors, etc.), and other similar electronic devices that can use USB interfaces for communication, battery charging, and/or power delivery.

As used herein, "USB-enabled" device or system refers to a device or system that includes, is configured with, or is otherwise associated with a USB connector interface. A USB-enabled electronic device may comply with at least one release of a Universal Serial Bus (USB) specification. Examples of such USB specifications include, without limitation, the USB Specification Revision 2.0, the USB 3.0 Specification, the USB 3.1 Specification, the USB 3.2 Specification and/or various supplements, versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C (also referred to herein as "USB-C"), is defined in various releases and/or versions of the USB Type-C specification. The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX−lines, among others. In addition, a Type-C port also provides a Sideband Use (denoted SBU) line for signaling of sideband functionality and a Configuration Channel (or communication channel, denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides pins for four VBUS lines, four ground return (GND) lines, two D+ lines (DP1 and DP2), two D−lines (DN1 and DN2), two SSTX+ lines (SSTXP1 and SSTXP2), two SSTX−lines (SSTXN1 and SSTXN2), two SSRX+ lines (SSRXP1 and SSRXP2), two SSRX−lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification. The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, etc. As used herein, "USB-PD subsystem" refers to one or more logic blocks and other analog/digital hardware circuitry, which may be controllable by firmware in an IC controller and which is configured and operable to perform the functions and to satisfy the requirements specified in at least one release of the USB-PD specification. The IC controller can be implemented in a USB Type-C device. The IC controller can be implemented in a USB device.

Power delivery in accordance with the USB-PD specification(s) can be embodied in several different types of USB Type-C applications. Examples of such types of Type-C applications include, but may not be limited to: a downstream facing port (DFP) application, in which an IC controller with a USB-PD subsystem is configured to provide a downstream-facing USB port (e.g., in a USB-enabled host device); an upstream facing port (UFP) application, in which an IC controller with a USB-PD subsystem is configured to provide an upstream-facing USB port (e.g., in a USB-enabled peripheral device or adapter); a dual role port (DRP) USB application, in which an IC controller with a USB-PD subsystem is configured to support both DFP and UFP applications on the same USB port (e.g., a USB Type-C port that is configured to operate as either a power provider or a power consumer or can alternate between these two roles dynamically by using USB-PD power role swap); and an active cable application, in which an IC controller with a USB-PD subsystem is disposed into, and configured to operate, an electronically marked cable assembly (EMCA) Type-C cable.

Details of a buck-boost converter are described below with respect to FIGS. 1A-1F. Also described herein are various embodiments directed to an IC controller that includes a controller coupled to a slope compensation circuit where the controller detects a transition of a buck-boost converter from a first mode having a first duty cycle to a second mode having a second duty cycle that is less than the first duty cycle. The controller controls the slope compensation circuit to nullify an error in an output caused by the transition. The controller can cause the slope compensation circuit to apply a charge stored in a capacitor during a first cycle to start a second cycle with a higher voltage than the first cycle. Details of these embodiments are described below with respect to FIGS. 2-10.

In addition, described herein are various embodiments directed to an IC controller that includes a controller coupled to a slope compensation circuit where the controller causes the slope compensation circuit to apply a first slope compensation to the input current in a first mode in which the buck-boost converter is operating in a discontinuous conduction mode (DCM). The controller detects a transition of the buck-boost converter from a first mode having a first duty cycle to a second mode and causes the slope compensation circuit to apply a second slope compensation to the input current. The second slope compensation starts at a maximum offset of the first slope compensation. Details of these embodiments are described below with respect to FIGS. 11-15.

In addition, described herein are various embodiments directed to an IC controller that includes digital control skip mode, such as described below with respect to FIGS. 16-20.

FIG. 1A is a schematic diagram of a buck-boost converter 100 in at least one embodiment. Buck-boost converter 100 includes an inductor 102, a first switch 104, a second switch 106, a third switch 108, and a fourth switch 110. Switches 104 and 110 are also referred to as high-side (HS) switches, and switches 106 and 108 are referred to as low-side (LS) switches. First switch 104 is coupled to an input voltage (Vin) 112 and fourth switch 110 is coupled to an output voltage (Vout) 114. The switches can be controlled to operate the buck-boost converter 100 in one of four modes, including a buck mode 116, a buck-boost (BB) buck mode 118, a BB boost mode 120, and a boost mode 122, as illustrated in a graph 130 of FIGS. 1B-1F.

Figure 1B:
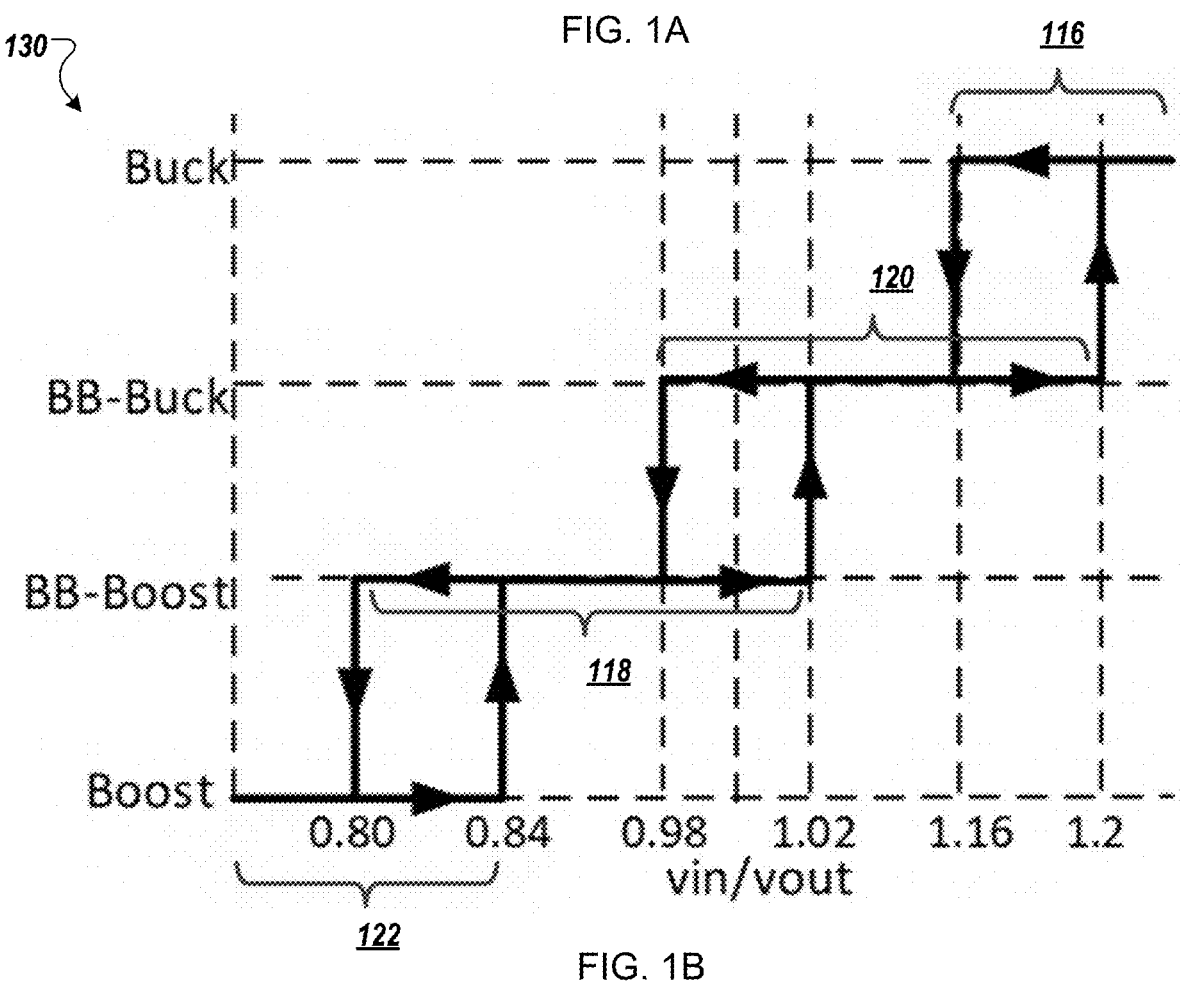
FIG. 1B is a graph illustrates three modes of a buck-boost converter and transitions between the three modes as a function of an input voltage and an output voltage in at least one embodiment.
Figure 1C:
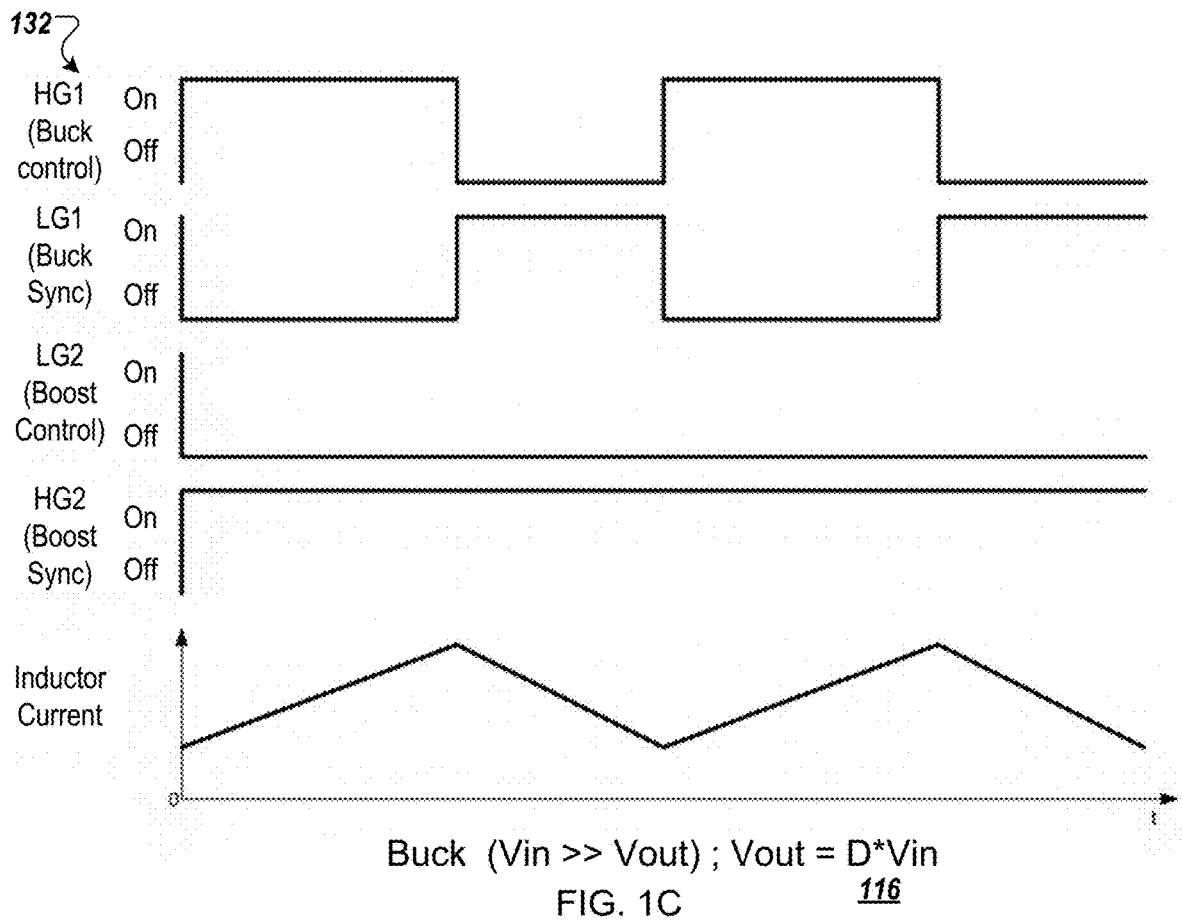
FIG. 1C is a timing diagram of control signals of a buck-boost converter in a buck mode in at least one embodiment.
Figure 1D:
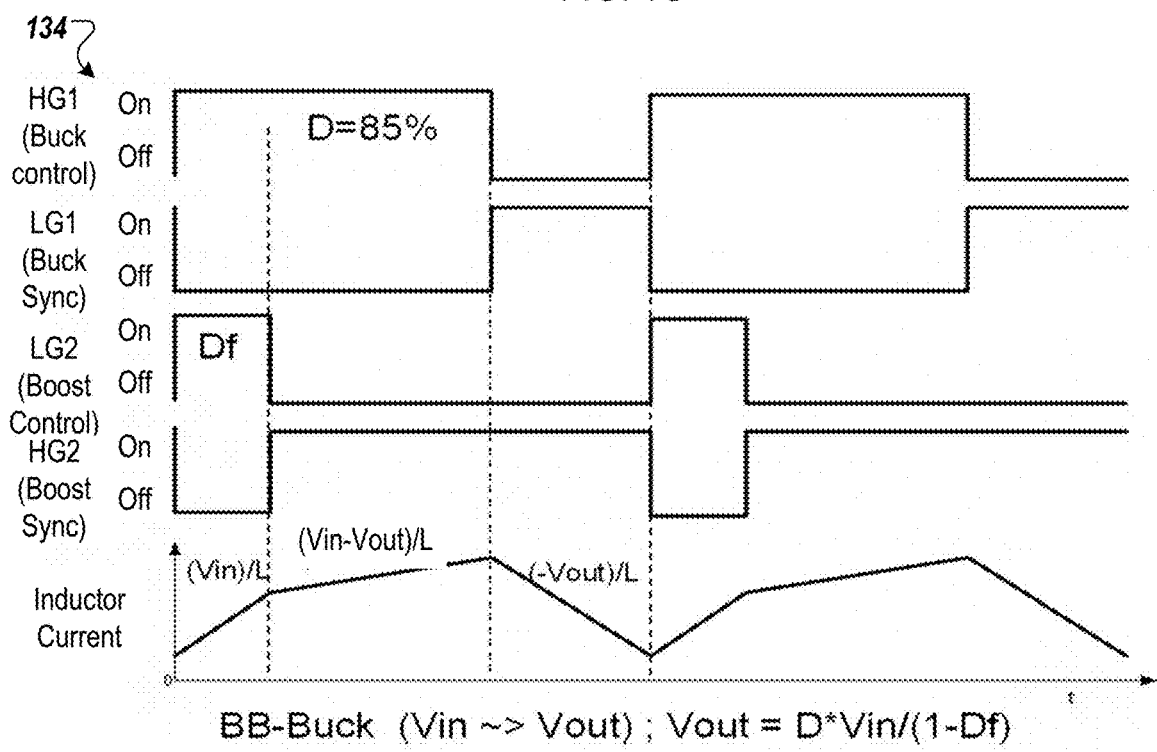
FIG. 1D is a timing diagram of control signals of a buck-boost converter in a buck-boost mode following a buck mode (BB-buck) mode in at least one embodiment.
Figure 1E:
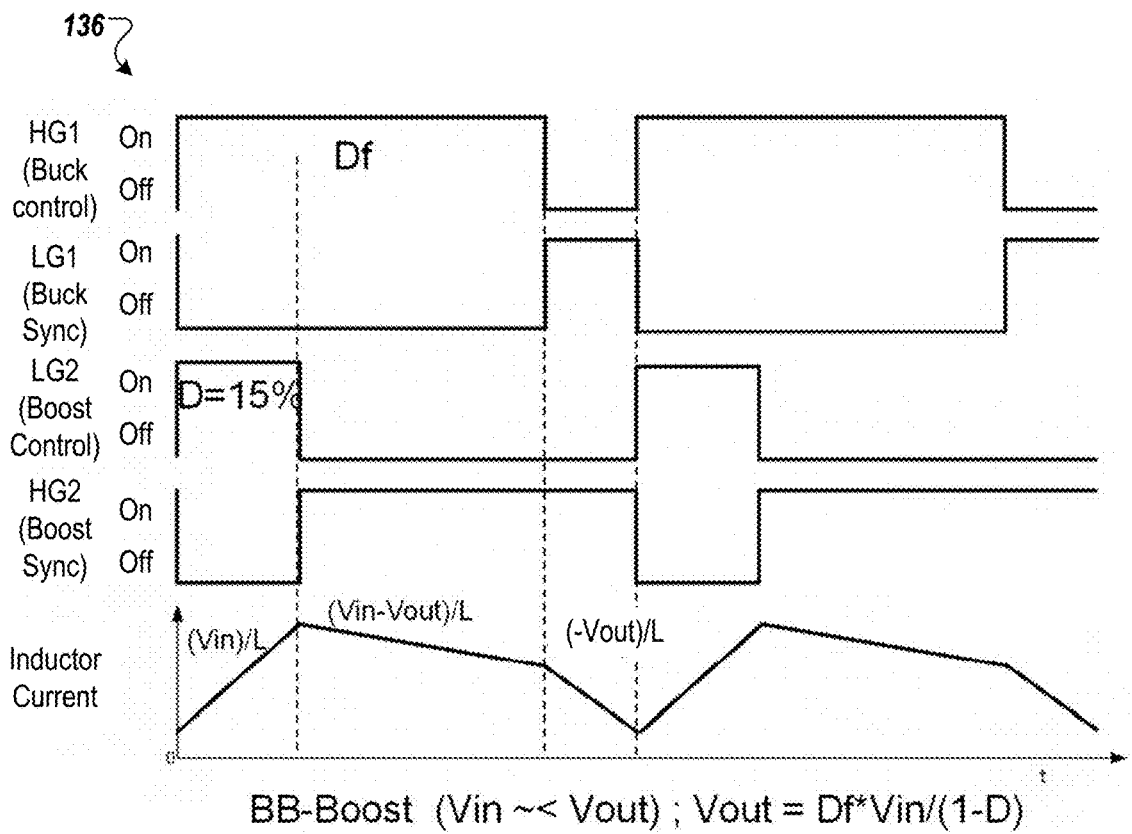
FIG. 1E is a timing diagram of control signals of a buck-boost converter in a buck-boost mode following a boost mode (BB-boost) mode in at least one embodiment.
Figure 1F:
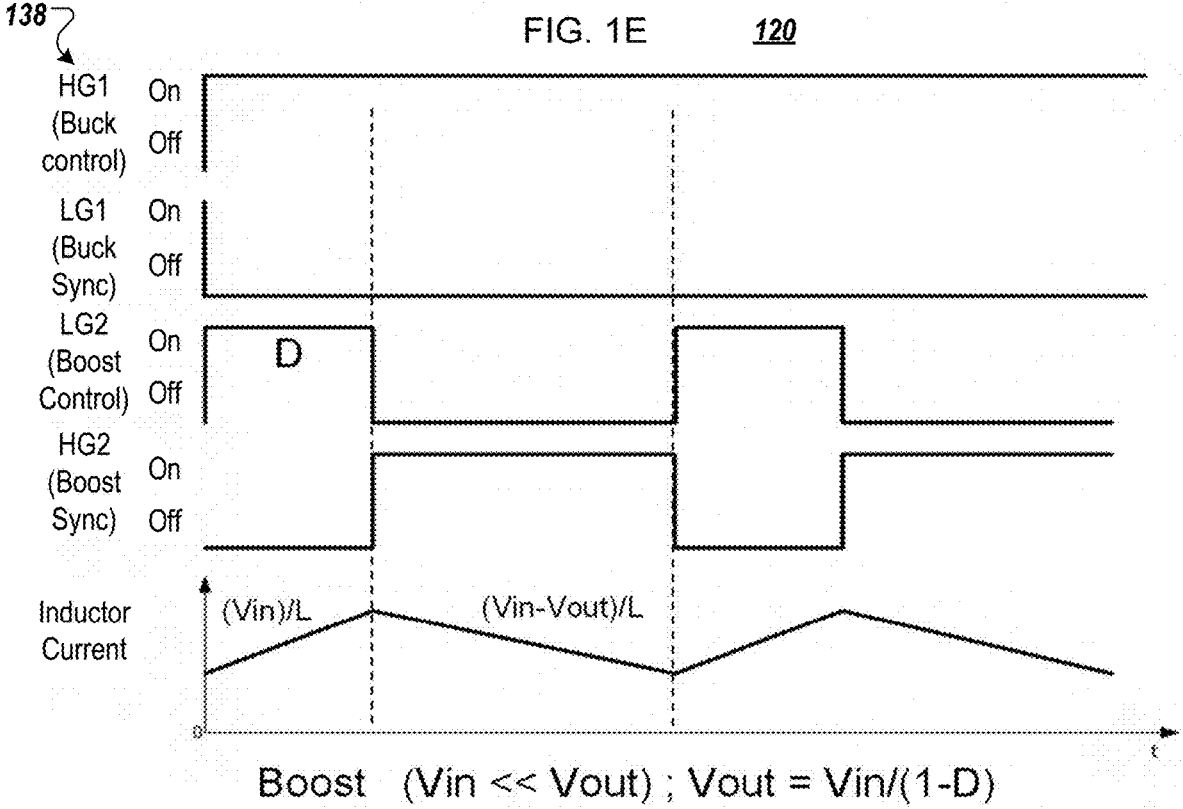
FIG. 1F is a timing diagram of control signals of a buck-boost converter in a boost mode in at least one embodiment.

FIG. 1B is a graph 130 illustrates three modes of a buck-boost converter and transitions between the three modes as a function of an input voltage (Vin) 112 and an output voltage (Vout) 114 in at least one embodiment. FIG. 1C is a timing diagram 132 of control signals of a buck-boost converter in a buck mode in at least one embodiment. FIG. 1D is a timing diagram 134 of control signals of a buck-boost converter in a buck-boost mode following a buck mode (BB-buck) mode in at least one embodiment. FIG. 1E is a timing diagram 136 of control signals of a buck-boost converter in a buck-boost mode following a boost mode (BB-boost) mode in at least one embodiment. FIG. 1F is a timing diagram 138 of control signals of a buck-boost converter in a boost mode in at least one embodiment.

During operation, buck-boost converter 100 is used to deliver power with wide output supply (e.g., 3.3V-22V) and wide load current range (e.g., 0A-5A) for USB-PD applications. Whenever there is a large change in Vin 112 or Vout 114, buck-boost converter 100 goes through different modes like Buck mode 116, BB-buck mode 118, BB-boost mode 120, or Boost mode 122. Along with an operating voltage, load current adds two or three more modes to buck-boost converter 100, including a continuous conduction mode (CCM), a discontinuous conduction mode (DCM), and optionally a skip mode as described herein below with respect to FIGS. 16-21. Buck-boost converter 100 operates in CCM mode at higher load current with a fixed switching frequency. Buck-boost converter 100 operates in DCM mode at moderate load current with a fixed switching frequency. Buck-boost converter 100 can operate in a skip mode (lower frequency) at low load current to get the best efficiency as described herein. Duty cycle (Ton/Tsw) needs to be changed instantaneously during these mode-transitions, otherwise it would result in large undershoot/overshoot on Vout 114 and potentially fail a USB-PD specification requirement. For example, in a mode-transition from BB-Boost to BB-Buck, duty cycle needs to be changed from 15% to 85%. To ensure stability of the converter, slope compensation is required. Addition of slope compensation can result in even higher movement of Error-Amplifier (EA) output from a minimum duty cycle to a maximum duty cycle, which in turn can cause Vout 114 to undershoot or overshoot. With limited gain and loop-bandwidth, loop itself cannot maintain Vout 114 within +/−5% for these mode-transitions, especially for low Vout voltages.

Aspects of the present disclosure overcome the deficiencies noted above and can maintain Vout 114 within +/−5% for these mode-transitions, especially for low Vout voltages by controlling a slope-compensation circuit to nullify an error caused by a transition, such as described in detail below with respect to FIGS. 2-10. Aspects of the present disclosure overcome the deficiencies noted above and can maintain Vout 114 within +/−5% for these mode-transitions, especially for low Vout voltages by controlling a slope-compensation circuit to start slope compensation from a previous cycle to continue adding a same slope compensation offset to avoid movement of an EA output, such as described in detail below with respect to FIGS. 11-15.

Figure 2:
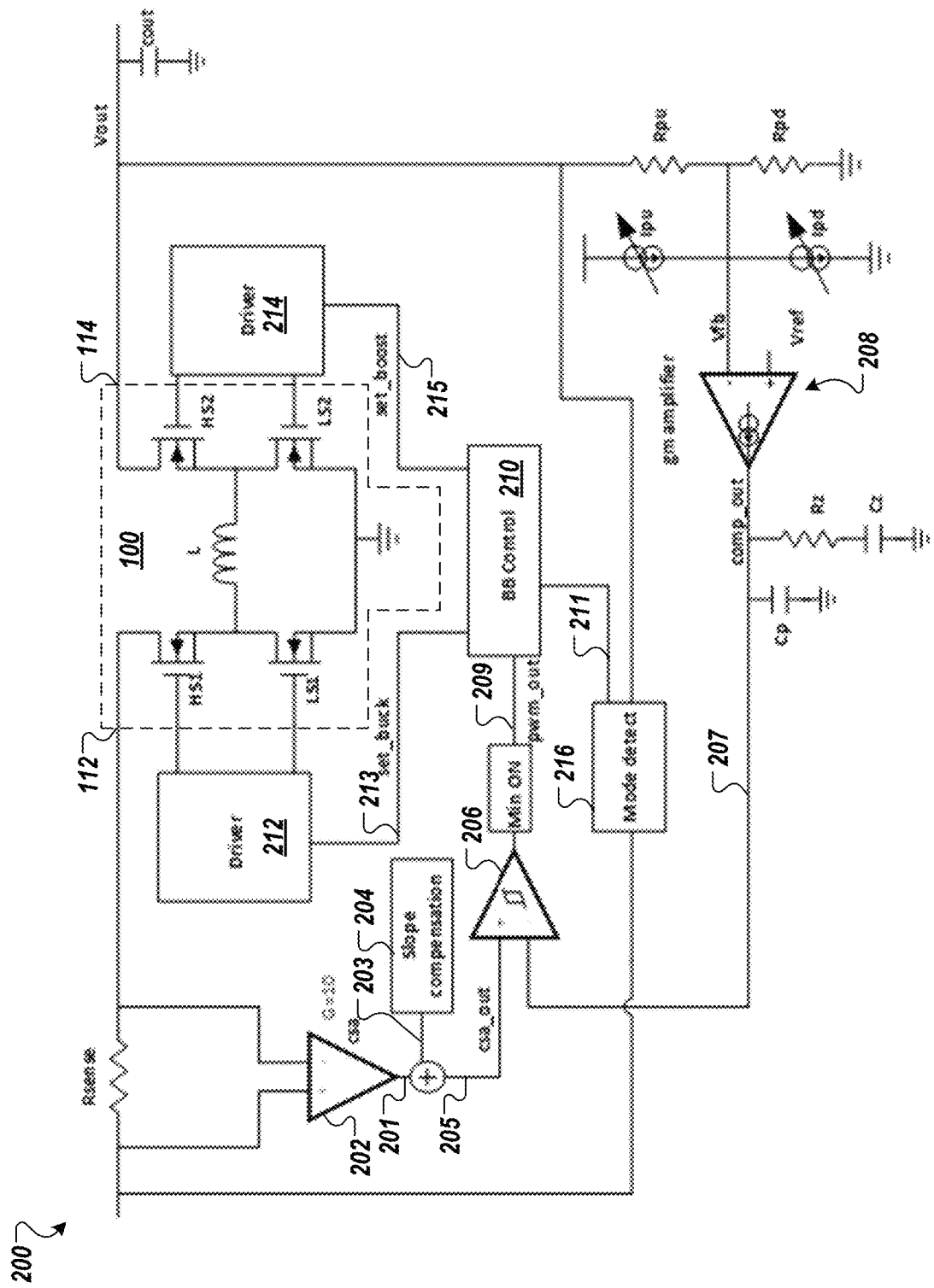
FIG. 2 is a block diagram of a USB controller coupled to a buck-boost converter in at least one embodiment.

FIG. 2 is a block diagram of a USB controller 200 coupled to a buck-boost converter 100 in at least one embodiment. USB controller 200 includes a current sense amplifier (CSA) 202, a slope compensation circuit 204, a comparator 206, an error amplifier (EA) 208, BB control logic 210, driver 212, driver 214, and mode detect logic 216. CSA 202 can measure an input current of buck-boost converter 100 and can output a CSA signal 201 indicative of the input current. Slope compensation circuit 204, which can include slope compensation logic and a slope compensation capacitor as described herein, is coupled to an output of CSA 202. Slope compensation circuit 204 can add an offset signal 203 (slope compensation offset) to CSA signal 201 when enabled, generating an offset CSA signal 205. In some cases, the offset signal 203 is a current or a charge. In other cases, the offset signal 203 can be a voltage signal if other circuits are used to add the offset signal 203 to CSA signal 201. Comparator 206 receives the offset CSA signal 205 and an EA signal 207 from EA 208. EA 208 compares Vout 114 against a voltage reference to generate EA signal 207. Comparator 206 compares offset CSA signal 205 and EA signal 207 and provides a control signal 209, referred to as pulse width modulation (PWM) out, to BB control logic 210. BB control logic 210 receives control signal 209 and a mode signal 211 from mode detect logic 216. Mode detect logic 216 can determine a mode and a transition between modes based on Vout 114 and Vin 112 and outputs mode signal 211 accordingly. BB control logic 210 uses the control signal 209 and mode signal 211 to control a mode of buck-boost converter 100. In particular, BB control logic 210 can send a first control signal 213 to driver 212 that controls first and second switches of buck-boost converter 100 and a second control signal 215 to driver 214 that controls third and fourth switches of buck-boost converter 100.

In at least one embodiment, mode detect logic 216 receives and measures Vout 114 and Vin 112 and determines whether Vin meets or exceeds a first threshold associated with Vin approaching Vout, such as in a mode transition from BB-Boost mode to BB-Buck mode. In at least one embodiment, mode detect logic 216 determines whether Vout meets or exceeds a second threshold associated with Vout approaching Vin, such as in a mode transition from BB-Buck mode to BB-Boost mode. Alternatively, mode detect logic 216 can determine whether buck-boost converter 100 is in boost mode or buck mode based on Vout and Vin.

As described herein, a USB-C/PD power supply can be used to deliver power with wide output voltage range of 3.3V-21.5V with input supply range from 5.0V to 24V and the USB PD specification has a requirement that the USB-C/PD power supply meets an output voltage (Vout) within +/−5% during line (Vin) transient and maintain Vout monotonicity during transitioning from one voltage to another. Whenever there is a large change in Vin or Vout, a power converter goes through different modes like Buck mode, BB-buck mode, BB-boost mode, or Boost mode, and the duty cycle (Ton/Tsw) needs to be changed instantaneously during these mode-transitions, otherwise it would result in large undershoot/overshoot on Vout and fail the USB-PD specification requirements. For example, mode-transition from BB-Boost to BB-Buck, Duty cycle needs to be changed from 15% to 85%, such as illustrated in FIG. 3.

Figure 3:
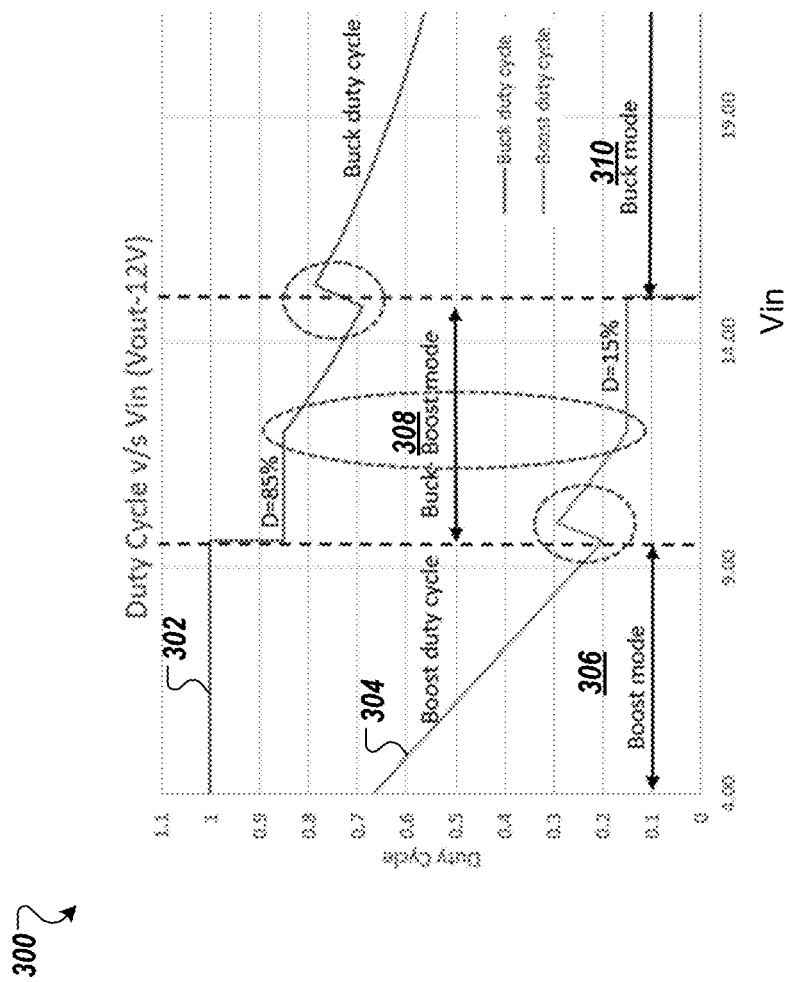
FIG. 3 is a timing diagram of a duty cycle as a function of an input voltage (Vin) in at least one embodiment.

FIG. 3 is a timing diagram 300 of a buck duty cycle 302 and a boost duty cycle 304 as a function of an input voltage (Vin) in at least one embodiment. In a boost mode 306, buck duty cycle 302 has a duty cycle of 1.0. In a buck-boost mode 308, buck duty cycle 302 has a duty cycle of 0.85 for a portion of buck-boost mode 308 and transitions to have a duty cycle of 0.7 through another portion of buck-boost mode 308. In a buck mode 310, buck duty cycle 302 transitions between approximately 0.79 to 0.55. In a boost mode 306, boost duty cycle 304 transitions between approximately 0.69 to 0.2. In a buck-boost mode 308, boost duty cycle 304 has a duty cycle of 0.15 for a portion of buck-boost mode 308 and transitions from 0.15 to approximately 0.3 through another portion of buck-boost mode 308. In a buck mode 310, boost duty cycle 304 has a duty cycle of 0.

As described herein, to ensure stability of the power converter, slope-compensation can be used, but the addition of slope compensation can result in even higher movement of EA output from a minimum to maximum duty cycle, which in-turn causes Vout to under/over-shoot, such as illustrated in FIGS. 4A-4B. FIG. 4A is a timing diagram 400 of a CSA signal 402 with a slope compensation added to an input current into a buck-boost converter in at least one embodiment. FIG. 4B is a timing diagram 420 illustrating an undershoot condition 422 on an output voltage (Vout) caused by a slope compensation during a transition from a BB-boost mode to a BB-buck mode in at least one embodiment. In some cases with limited gain and loop-bandwidth of a loop with the EA, the loop itself cannot maintain Vout within +/−5% for these mode-transitions, especially for low Vout voltages.

The embodiments described herein of USB controller 200 for a power converter include a mode-transition architecture to avoid large EA movements during mode transitions, thereby meeting the 5% Vout and monotonicity requirements across a wide range of input and output supply range. Referring back to FIG. 2, USB controller 200 can include a controller, such as made up of slope compensation logic of slope compensation circuit 204, mode detect logic 216 that controls the slope compensation circuit to nullify an error caused by a transition from a first mode having a first duty cycle to a second mode having a second duty cycle. The second duty cycle can be less than the first duty cycle. Alternatively, the second duty cycle can be more than the first duty cycle depending on a convention of modes. The controller can detect a transition of buck-boost converter 100 from a first mode (e.g., BB-buck mode) having a first duty cycle (e.g., 85%) to a second mode (e.g., BB-boost mode) having a second duty cycle (e.g., 15%) that is less than the first duty cycle. The controller can control slope compensation circuit 204 to nullify an error in the output caused by the transition. The controller can detect a transition of buck-boost converter 100 from the second mode to the first mode and can control slope compensation circuit 204 to nullify an error in the output caused by the transition (e.g., 15% to 85% duty cycle).

Figure 5A:
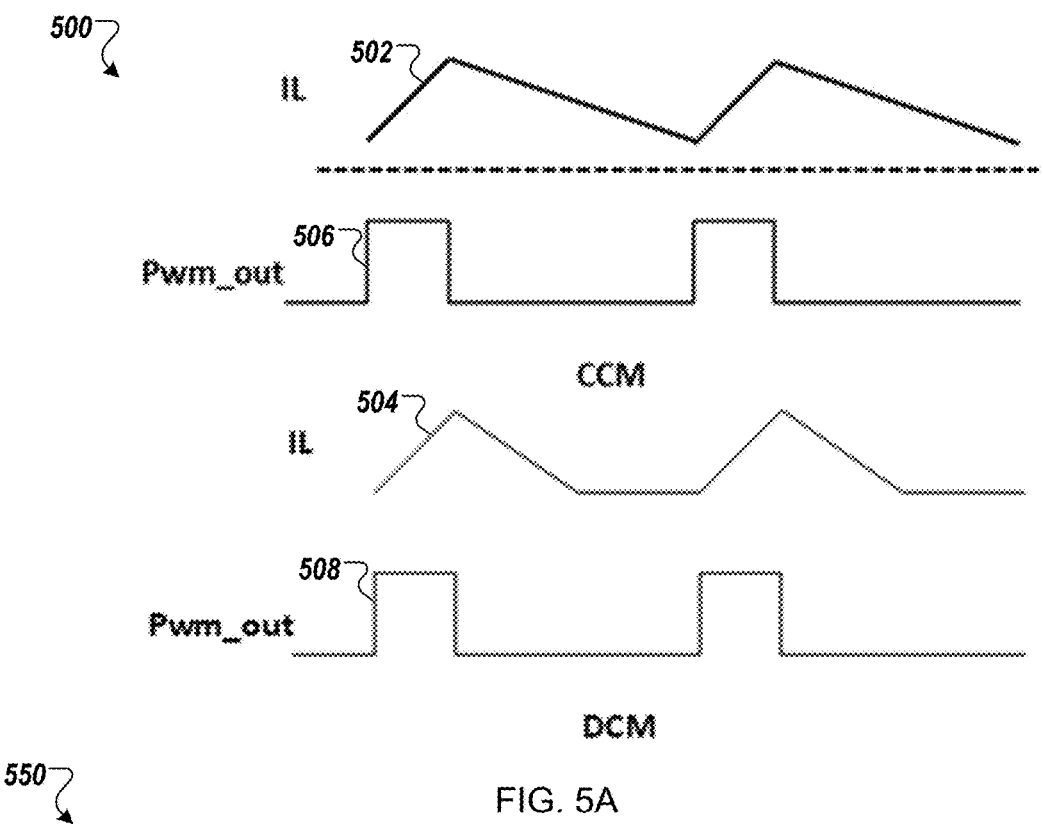
FIG. 5A is a timing diagram of an inductor current and a control signal in a continuous conduction mode (CCM) and in a discontinuous conduction mode (DCM) in at least one embodiment.

As described above, USB controller 200 can operate in CCM or DCM, as illustrated in FIG. 5A.

FIG. 5A is a timing diagram 500 of an inductor current and a control signal in a continuous conduction mode (CCM) and in a discontinuous conduction mode (DCM) in at least one embodiment. USB controller 200 is in CCM if the inductor current 502 does not go to zero in every cycle, resulting in the inductor always being energized. CCM is used to support higher load current. The frequency of the operation is constant during this mode. USB controller 200 is in DCM if the inductor current 504 goes to zero in every cycle, resulting in the inductor being de-energized for a certain amount of time during the cycle. This amount of time is referred to as dead time. DCM is used to support moderate load current. The frequency of the operation is constant during this mode. Timing diagram 500 also shows a control signal 506 (e.g., PWM out) that is sent to BB control logic to control the operation of buck-boost converter in CCM and a control signal 508 (e.g., PWM out) that is sent to BB control logic to control the operation of buck-boost converter in DCM. The following describes the various signals, including slope compensation, during DCM as an example.

Figure 5B:
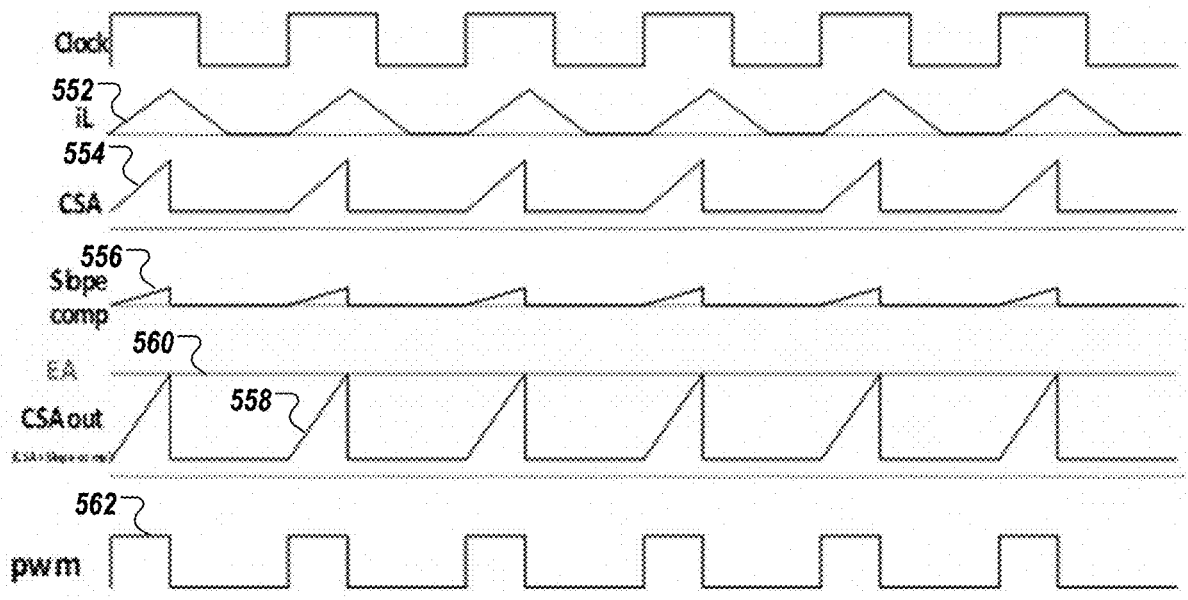
FIG. 5B is a timing diagram illustrating a current output signal based on an input current component and a slope compensation component in at least one embodiment.
Figure 6:
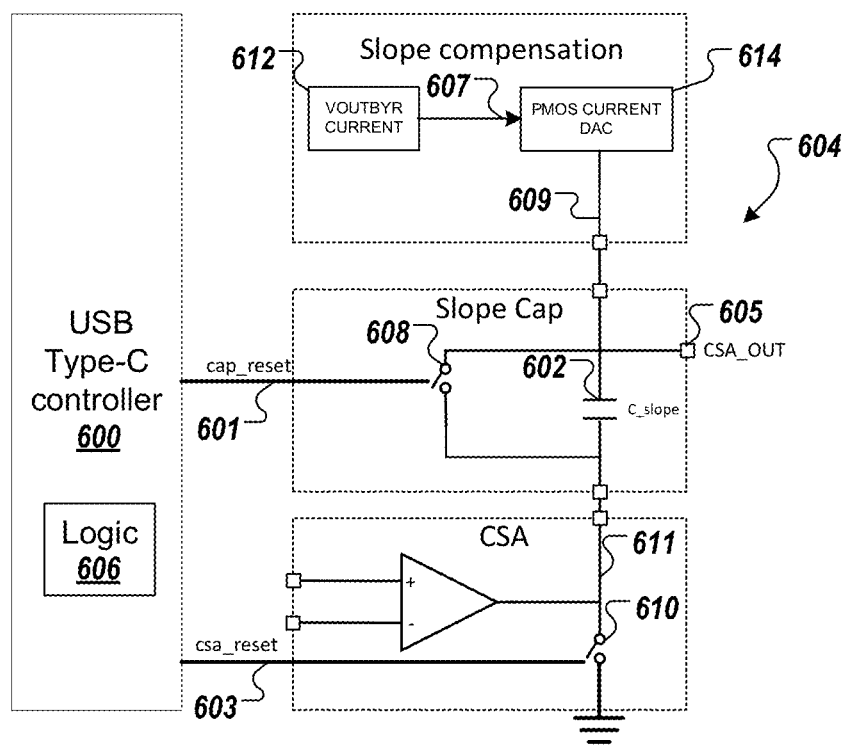
FIG. 6 is a block diagram of a USB Type-C controller that controls a slope compensation capacitor of a slope compensation circuit to nullify an error caused by a transition in at least one embodiment.
Figure 7:
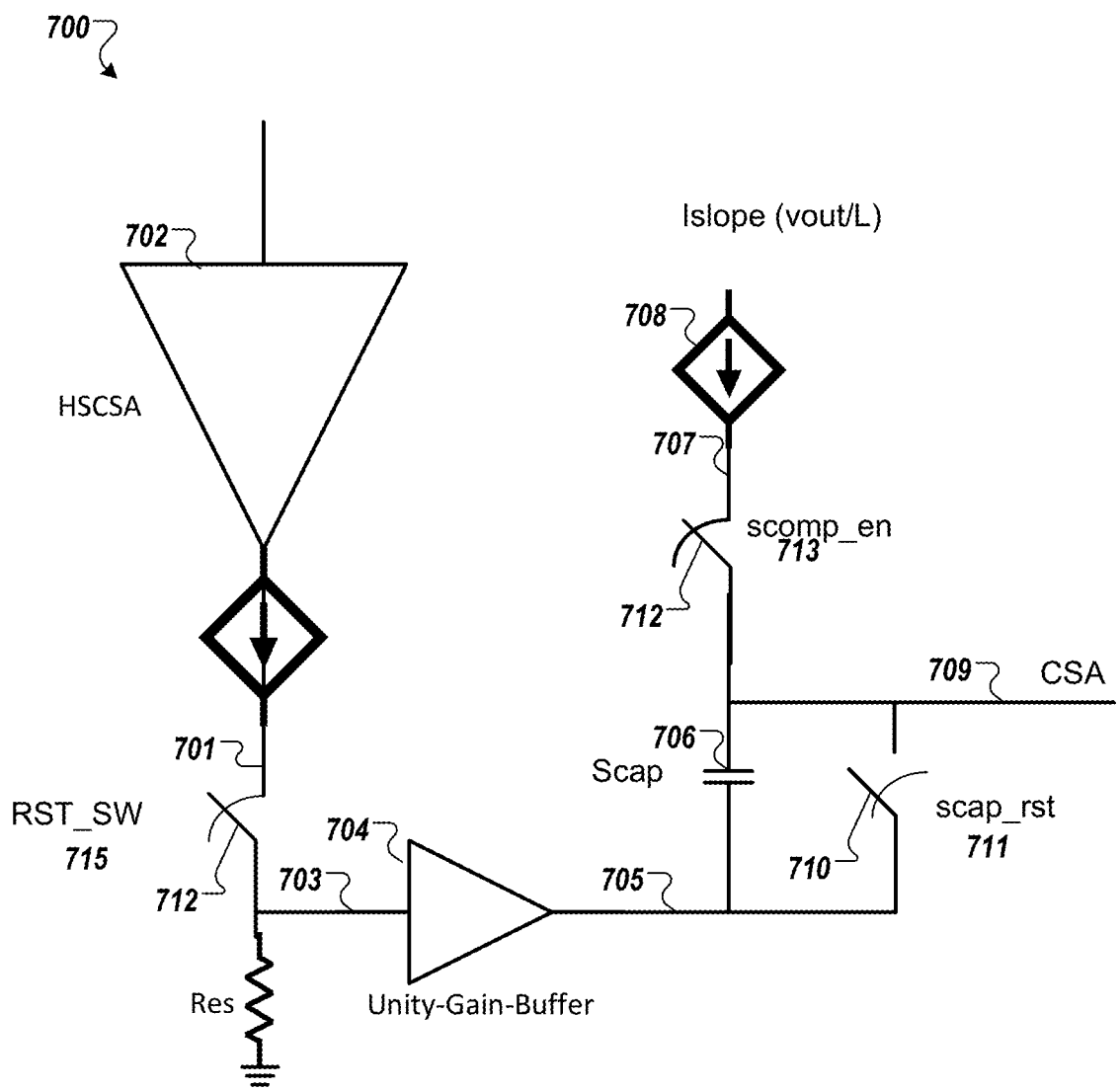
FIG. 7 is a schematic diagram of a slope compensation circuit that is controlled to nullify an error caused by a transition in at least one embodiment.
Figure 8:
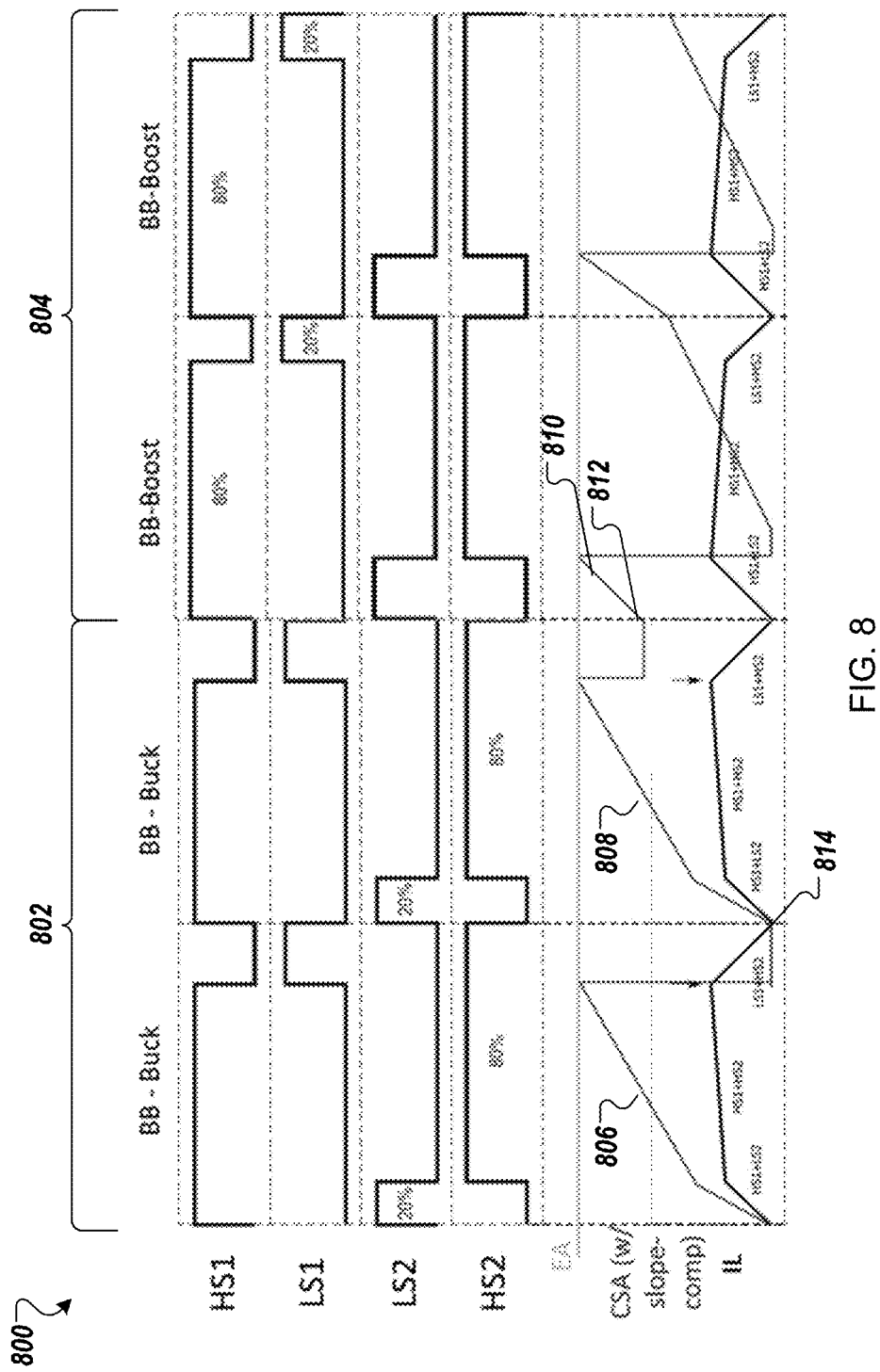
FIG. 8 is a timing diagram illustrating a current output signal based on an input current component and a slope compensation component where a charge stored during a previous cycle is applied to start a next cycle with a higher voltage than the previous cycle in at least one embodiment.

FIG. 5B is a timing diagram 550 illustrating a current output signal (CSA out) based on an input current (CSA) component and a slope compensation component in at least one embodiment. At the beginning of every clock cycle, a switch of the buck-boost converter is turned on and an inductor current (iL) 552 builds up. The inductor current 552 is sensed by a CSA and generates an output called CSA component 554. Slope compensation circuit generates a slope compensation component 556 that is added for current mode instability. CSA component 554 and slope compensation component 556 are added as CSA out 558 and compared to error amplifier output (EA) level 560 every cycle. For an inductor value, EA output voltage is an indication of the power the buck-boost converter is demanding, where the higher the voltage the higher the power delivery as the turn ON time increases with increase in EA output. When CSA out 558 reaches EA level 560, a control signal 562 (PWM) toggles and resets the switch, causing the inductor current to decrease until it reaches zero in DCM. There is a dead time in every cycle in DCM where the inductor current is zero and again the switch turns on in the next clock cycle and this process repeats. During some mode transitions, the movement required in EA can be very high and can cause output to undershoot or overshoot. The undershoot or overshoot conditions can cause the output voltage to vary in an amount that is greater than allowed in a USB-PD specification. EA is very slow-moving signal due to the compensation component connected to it. By using the slope compensation component by a slope compensation circuit, such as illustrated in FIGS. 6-7, the same EA voltage can be maintained, reducing the movement required by EA whenever there is a mode transition, such as illustrated in FIG. 8. As described herein, in addition to controlling the slope compensation circuit to nullify an error, the slope percentage and delay for starting the slope compensation are programmable, further minimizing the movement of EA further.

FIG. 6 is a block diagram of a USB Type-C controller 600 that controls a slope compensation capacitor 602 of a slope compensation circuit 604 to nullify an error caused by a transition in at least one embodiment. USB Type-C controller 600 includes logic 606 that can detect a transition of a buck-boost converter from a first mode to a second mode, as described herein. Logic 606 outputs a first control signal 601 (cap_reset) to reset slope compensation capacitor 602 using a first switch 608 and outputs a second control signal 603 (csa_reset) to reset a CSA output using a second switch 610.

In at least one embodiment, logic 606 detects a transition of a buck-boost converter from a first mode having a first duty cycle to a second mode having a second duty cycle that is less or more than the first duty cycle. Slope compensation capacitor 602 stores a slope compensation component during a first cycle. Logic 606, using first control signal 601 can hold or remove the slope compensation component from a CSA output 605 to remove an error caused by the transition. The transition between modes can be mode transitions in either direction between BB-buck and BB-boost modes. In one embodiment, logic 606 can detect a transition from a buck-boost mode that follows a buck mode (referred to herein as BB-buck mode) to a BB-boost mode. A charge is stored in slope compensation capacitor 602 during a first BB cycle and the charge is applied to the CSA output 605 during a second BB cycle. Applying the charge in the second BB cycle starts the second BB-cycle with a higher voltage than the first BB cycle, as illustrated in FIG. 8. In another embodiment, logic 606 can detect a transition from a BB-boost mode to a BB-buck mode. Although a charge can be stored by slope compensation capacitor 602, logic 606 disables the slope compensation during an entire first BB-boost cycle. For example, logic 606 can send first control signal 601 to discharge slope compensation capacitor 602 so that a slope compensation component is not added to CSA output 605. In some cases, a charge is stored during a first cycle and removed during a second cycle.

In at least one embodiment, slope compensation circuit 604, including slope compensation capacitor 602 and first switch 608, is controlled by USB Type-C controller 600. In at least one embodiment, slope compensation circuit 604 includes other components, such as a compensation logic 612 that specifies a digital value 607 indicative of a current 609 (slope compensation component) that is generated by a current digital-to-analog converter (DAC) 614. The current 609, when slope compensation is enabled, is added to a CSA signal 611 to generate CSA out 605. CSA signal 611 is indicative of an inductor current of a buck-boost converter and CSA out 605 is indicative of either the inductor current without slope compensation or inductor current with slope compensation. The inductor current with slope compensation can also be referred to as the offset output by the slope compensation circuit 604 that nullifies an error in the output of the CSA, the error being caused by the transition between modes.

In FIG. 6, USB Type-C controller 600 controls slope compensation circuit 604 to hold or remove a slope-compensation component from previous mode passing on to the next mode. The slope-compensation component introduces the error (or offset) while transitioning from 85% duty cycle of BB-Buck mode to 15% duty cycle of BB-Boost, for example. This error is nullified by holding slope compensation capacitor 602 in a BB-Buck cycle by not resetting slope compensation capacitor and starting CSA output 605 with a higher voltage in a next cycle. This ensures that the duty cycle of 85% in BB-Buck mode is transitioned to the duty cycle of 15% in BB-boost mode without moving EA at all. Similarly, a mode-transition from BB-Boost mode to BB-buck mode, the slope-compensation component is removed by keeping first switch 608 on for a specified time, such as an entire cycle. In one embodiment, USB Type-C controller 600 is configured to maintain an output voltage (Vout) within a specified percentage range during a change in an input voltage (Vin) from a first voltage to a second voltage. In another embodiment, USB Type-C controller 600 is configured to maintain monotonicity of Vout during a change of Vout from a first voltage to a second voltage.

In one embodiment, USB Type-C controller 600 includes a hardware state machine to detect a transition from a first mode to a second mode and can send one or more control signals to slope compensation circuit 604 to nullify the error in the output caused by the transition.

FIG. 7 is a schematic diagram of a slope compensation circuit 700 that is controlled to nullify an error caused by a transition in at least one embodiment. Slope compensation circuit 700 receives an input current 701 from a CSA 702 and converts the input current to an input voltage 703. A unity gain buffer 704 can receive input voltage 703 to generate a CSA signal 705. Slope compensation circuit 700 also includes a capacitor 706 and a programmable current source 708 that generate a slope compensation signal 707. Capacitor 706 is coupled to an output node and the output of CSA 702. Capacitor 706 stores a charge that can be applied as an initial offset in CSA output 709 during a subsequent cycle. That is, slope compensation circuit 700 can hold a slope-compensation component from a previous mode for passing it on to a next mode. Programmable current source 708 can be enabled or disabled using a switch 712 with a control signal 713 (scomp_en). As described above, the slope-compensation component introduces the error (or offset) while transitioning from a first duty cycle to a second duty cycle that is less than the first duty cycle. The error is nullified by holding the charge in capacitor 706 by not resetting a switch 710 with a control signal 711 (scap_rst) and starting CSA output 709 with a higher voltage in a next cycle. Switch 710 is coupled between the output node and the output of the CSA 702. This ensures that the first duty cycle (e.g., 85% in BB-Buck mode) is transitioned to the second duty cycle (e.g., 15% in BB-boost mode) without moving EA at all. Similarly, a mode-transition from the second mode to the first mode, the slope-compensation component is removed from capacitor 706 by resetting switch 710 for a specified time, such as an entire cycle. Compensation logic in a controller or a state machine in the controller can be configured to keep track of these transitions happening and can trigger control signals 711, 713 accordingly. In addition, a switch 714 can be controlled by a control signal (RST_SW) that resets CSA signal 705.

In one embodiment, slope compensation circuit 700 is configured to maintain an output voltage (Vout) within a specified percentage range during a change in an input voltage (Vin) from a first voltage to a second voltage. In another embodiment, slope compensation circuit 700 is configured to maintain monotonicity of Vout during a change of Vout from a first voltage to a second voltage. In one embodiment, slope compensation circuit 700 is controlled by a hardware state machine that detects a transition from a first mode to a second mode and sends one or more control signals to slope compensation circuit 700 to nullify the error in the output caused by the transition. Corresponding waveforms are illustrated and described below with respect to FIGS. 8-9B.

FIG. 8 is a timing diagram 800 illustrating a current output signal (CSA out) based on an input current (CSA) component and a slope compensation component where a charge stored during a previous cycle is applied to start a next cycle with a higher voltage than the previous cycle in at least one embodiment. Timing diagram 800 illustrates a transition from a BB-buck mode 802 to a BB-boost mode 804. Timing diagram 800 illustrates a CSA signal 806 with a slope compensation added to an input current, indicative of inductor current (IL). During a first BB cycle in BB-buck mode 802, a first slope compensation 808 is applied. During a second BB-boost cycle in BB-boost mode 804, a second slope compensation 810 is applied. As described above, a capacitor can store a charge during the first BB cycle and by applying the charge in the second BB cycle starts the second BB cycle with a higher voltage 812 than a starting voltage 814 of the first BB cycle.

FIG. 9A is a timing diagram 900 of an input voltage (Vin) 902 and an output voltage (Vout) 904 using a slope compensation circuit to nullify an error caused by a transition in at least one embodiment. As illustrated in FIG. 9A, the slope compensation can maintain Vout 904 through a mode transition.

FIG. 9B is a timing diagram 920 of control signals to control a slope compensation circuit to nullify an error caused by a transition in at least one embodiment. Timing diagram 920 a first transition between a BB-buck mode and a BB-boost mode and a second transition from a BB-boost mode to a BB-buck mode. Timing diagram 920 illustrates a CSA signal 922 with a slope compensation added to an input current, indicative of inductor current (IL). For the first transition, a first slope compensation is applied during a first BB cycle in BB-buck mode and a second slope compensation is applied during a subsequent cycle in BB-boost mode. As described above, a capacitor can store a charge during the first BB cycle and by applying the charge in the second BB cycle, the second BB cycle starts the second BB cycle with a higher voltage 928 than a starting voltage of the first BB cycle. This can be controlled by using a first control signal 924 and a second control signal 926. First control signal 924 does not reset the capacitor and second control signal 926 disables the slope compensation circuit so that the higher voltage 928 is applied during the second BB cycle. For the second transition, a first slope compensation is applied during a third BB cycle in BB-boost mode and a second slope compensation is applied during a subsequent fourth cycle in BB-buck mode. In this transition, first control signal 924 is used to hold a reset of the capacitor over a specified period so that the charge on the capacitor is removed from the second slope compensation. As a result, the subsequent fourth cycle starts at a lower voltage 930. Using control signals 924, 926, an error in CSA output can be nullified to maintain Vout 904 through a mode transition.

Figure 10:
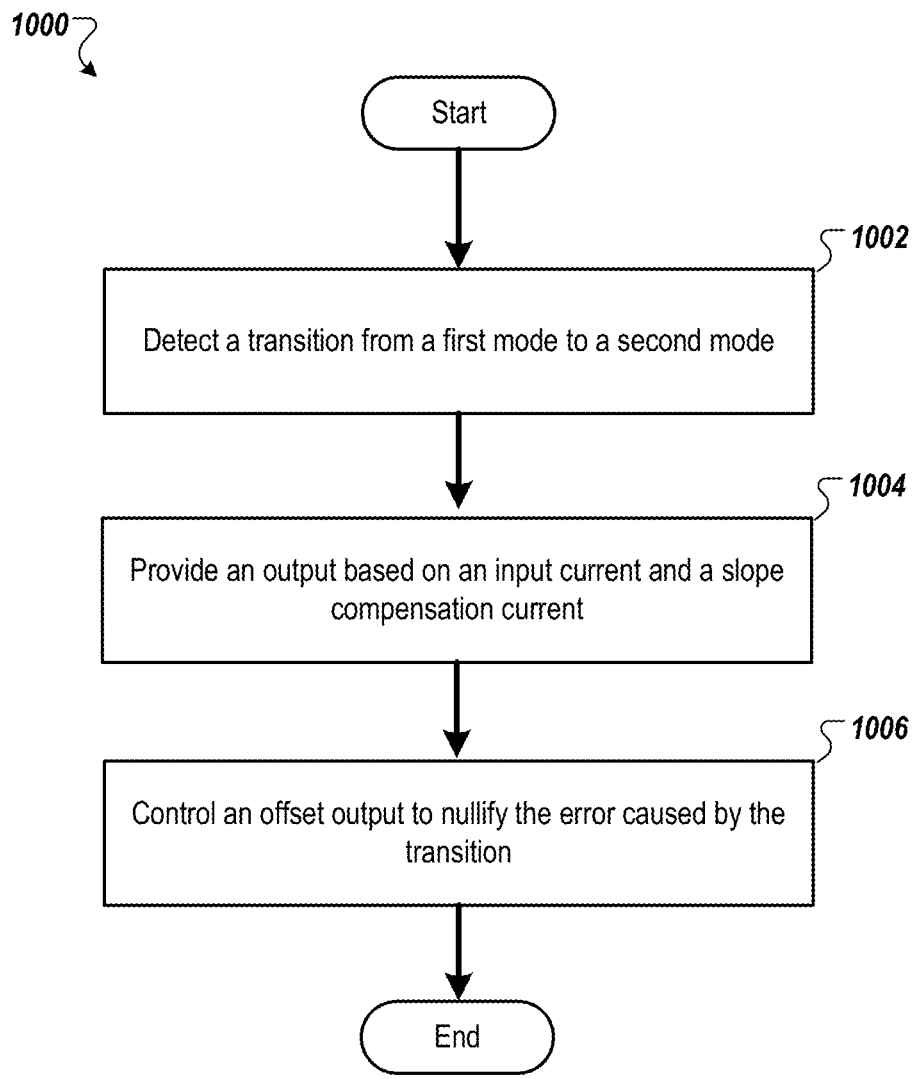
FIG. 10 is a flow diagram of a method of controlling a slope compensation circuit to nullify an error caused by a transition between a first mode and a second mode in at least one embodiment.

FIG. 10 is a flow diagram of a method 1000 of controlling a slope compensation circuit to nullify an error caused by a transition between a first mode and a second mode in at least one embodiment. Method 1000 can be performed by processing logic comprising hardware, firmware, or any combination thereof. Method 1000 can be performed by USB controller 200 of FIG. 2. In another embodiment, method 1000 can be performed by slope compensation circuit 204. In another embodiment, method 1000 can be performed by USB Type-C controller 600 of FIG. 6.

Referring back to FIG. 10, method 1000 begins by processing logic detecting a transition of a buck-boost converter from a first mode having a first duty cycle to a second mode having a second duty cycle that is less than the first duty cycle (block 1002). Processing logic provides an output based on an input current and a slope compensation current (block 1004). The output includes an error caused by the transition. Processing logic controls an offset output to nullify the error caused by the transition (block 1006), and method 1000 ends.

In a further embodiment in which the first mode is a BB-buck mode, processing logic causes a charge to be stored in a capacitor during a first BB cycle. Processing logic causes the charge to be applied during a second BB cycle to start the second BB cycle with a higher voltage than the first BB cycle.

In a further embodiment in which the first mode is a BB-boost mode, processing logic disable slope compensation during a first BB cycle and enables slope compensation during a second BB cycle that follows the first BB cycle. In one embodiment, processing logic causes a capacitor to store a slope compensation during the first BB cycle, but removes the slope compensation so that it is not applied during the second BB cycle.

In one embodiment, processing logic can detect a transition by measuring an output voltage (Vout) and an input voltage (Vin). Processing logic can determine that the transition is from a BB-boost mode to a BB-buck mode when the input voltage (Vin) meets or exceeds a first threshold associated with Vin approaching Vout. In another embodiment, processing logic can determine that the transition is from a BB-buck mode to a BB-boost mode when the output voltage (Vout) meets or exceeds a second threshold associated with Vout approaching Vin.

The following embodiments are directed to an IC controller that includes a controller coupled to a slope compensation circuit where the controller causes the slope compensation circuit to apply a first slope compensation to the input current in a first mode in which the buck-boost converter is operating in a DCM. The controller detects a transition of the buck-boost converter from a first mode having a first duty cycle to a second mode and causes the slope compensation circuit to apply a second slope compensation to the input current. The second slope compensation starts at a maximum offset of the first slope compensation. By using the slope compensation component, the same EA voltage can be maintained by adding offset to the CSA output using slope compensation using a programmable slope percentage per mode, a programmable delayed start of slope compensation, or both. This reduces the movement required by EA whenever there is a mode transition. To reduce the EA movement, the slope compensation component is altered dynamically in every mode to reduce the movement of EA. For example, the slope compensation component can be turned on after a delay (Td) from a reset (PWM reset). The slope compensation component moves with PWM, which helps in maintaining the same EA output voltage. Delaying the slope compensation component adds the offset based on the time duration of the switch turn ON. Moreover, the slope compensation component that needs to be added and the delay for which the slope compensation is turned off are programmable and can be used to minimize the movement of EA further. Details of these embodiments are described below with respect to FIGS. 11-15. It should be noted that the embodiments of the compensation circuit described above with respect to FIGS. 2, 6-7 are applicable to the embodiments of FIGS. 16-21.

Figure 11:
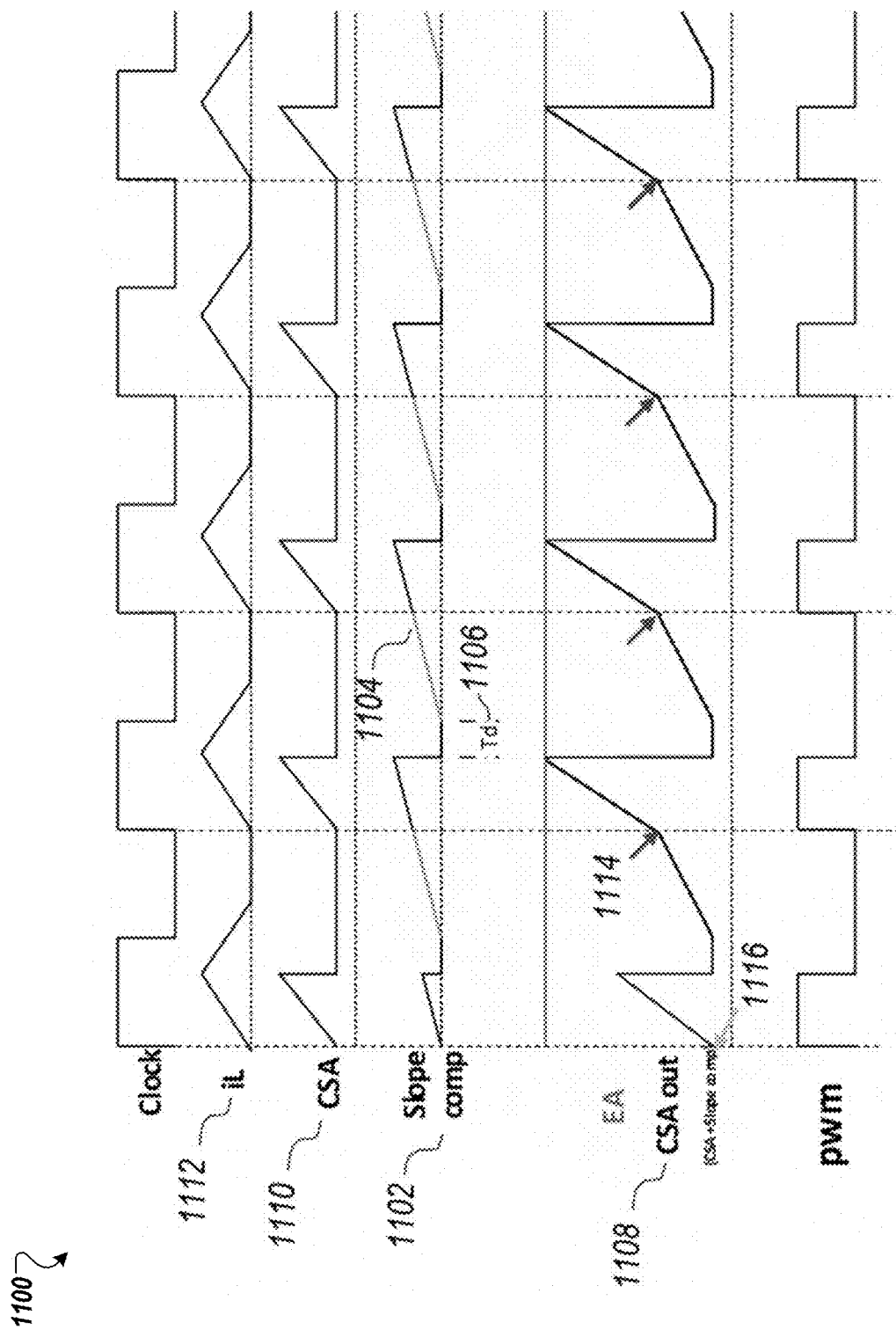
FIG. 11 is a timing diagram of a slope compensation signal in which a slope compensation component in a cycle is delayed by a programmable amount in at least one embodiment.

FIG. 11 is a timing diagram 1100 of a slope compensation signal 1102 in which a slope compensation component 1104 in a cycle is delayed by a programmable amount 1106 (Td) in at least one embodiment. It also illustrates a CSA_OUT signal 1108 with a slope compensation component 1104 that is added to CSA signal 1110 which is indicative of inductor current (iL) 1112. Starting a slope compensation component from the previous cycle enables starting CSA_OUT from a higher offset voltage as indicated by 1114 instead of starting from a lower voltage 1116 at the beginning of every switching cycle. This additional offset 1114 helps to maintain EA at the same voltage for subsequent cycles in the second mode after a mode transition from first mode to second mode. A programmable delay (Td) 1106 can be used in different modes to provide a different offset 1114 in the different modes which can help to maintain an EA to the same voltage through-out multiple modes along with a method of nullifying error in CSA output (e.g., CSA_OUT) using offset adding or canceling during mode transition.

Figure 12:
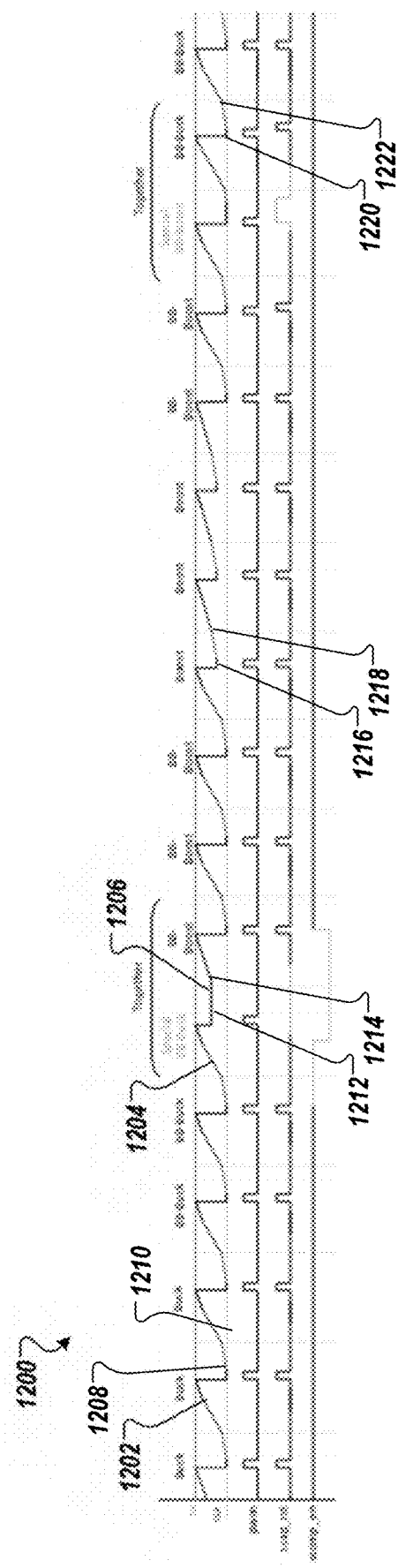
FIG. 12 is a timing diagram of a slope compensation signal that starts slope compensation from a previous cycle to continue adding a same slope compensation offset to avoid movement of an error amplifier (EA) in at least one embodiment.

In other embodiments, the slope compensation component can be started from a previous cycle to continue adding a same slope compensation offset to avoid EA movement, such as illustrated in FIG. 12.

FIG. 12 is a timing diagram 1200 of a slope compensation signal 1202 that starts slope compensation from a previous cycle 1204 to continue adding a same slope compensation offset 1206 to avoid movement of an error amplifier (EA) output in at least one embodiment. In a mode transition between a first mode (for example, BB-buck mode) and a second mode (for example, BB-boost mode), the slope compensation from the previous cycle 1204 of first mode is passed to the first cycle of second mode to avoid EA movement from first mode to second mode. In the second mode, the slope compensation is started from previous cycle 1212 (after programmable Td delay as shown in FIG. 11) so as to start CSA from an offset voltage 1214 at the beginning of the next cycle. This addition of slope compensation from a previous cycle is done for every subsequent cycle of the second mode. This helps to maintain EA at same level in second mode (for example, BB-boost mode) in all cycles. Similar slope compensation component addition is done in all modes as shown by 1216, 1220, and 1208 which helps to start every cycle of each mode by an offset 1218, 1222, and 1210 in respective modes. In at least one embodiment, the offset introduced by slope compensation component in every cycle is always the same as slope compensation component is started from the previous cycle itself. This helps to keep EA (and Vout) steady without a need of sample and hold circuit with regular refresh throughout all modes of buck-boost. Offset is altered only at the boundaries of mode-transition to take care of sudden a duty-cycle change requirement.

Adding the same slope compensation offset can improve low current operation in DCM. That is, adding the same slope compensation offset in each cycle can improve Vout ripple, such as illustrated in two separate waveform graphs in FIGS. 13A-13B. In addition, a slope compensation percentage and a delay to start the slope compensation (scap_rst width) are programmable to alter slope compensation offsets. As the slope compensation percent and start time is programmable, there are many alternate schemes with which this system can be tuned to get better performance (ripple, response time) based on the Vin/Vout/Load combinations.

Figure 13A:
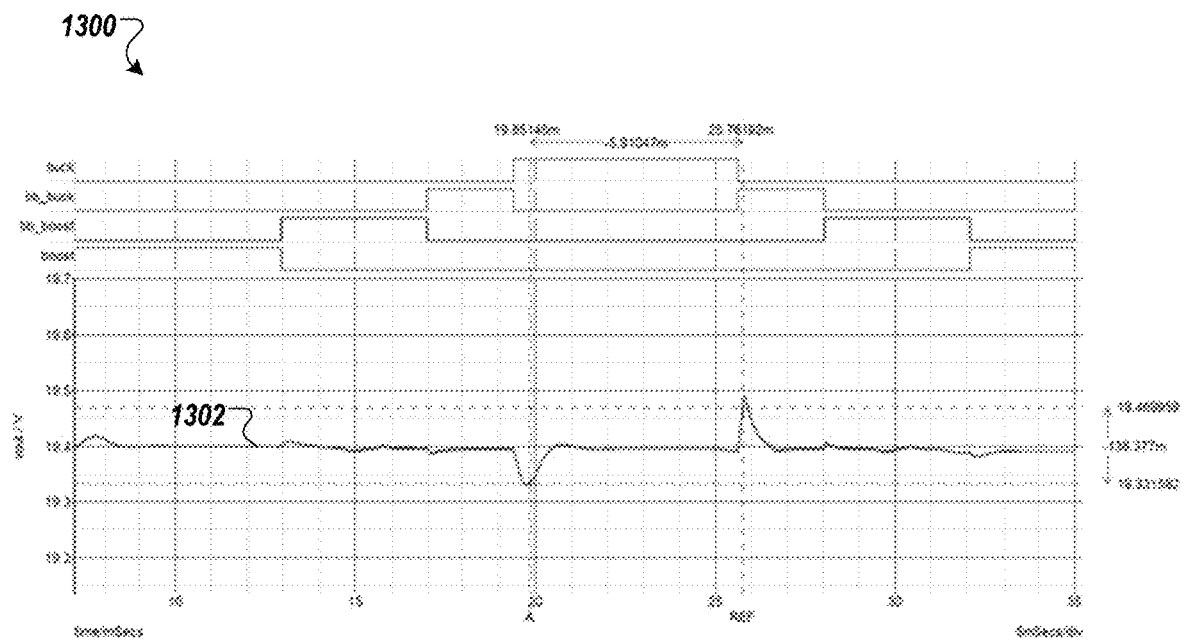
FIG. 13A is a timing diagram of an output voltage (Vout) using a first slope compensation scheme in at least one embodiment.
Figure 13B:
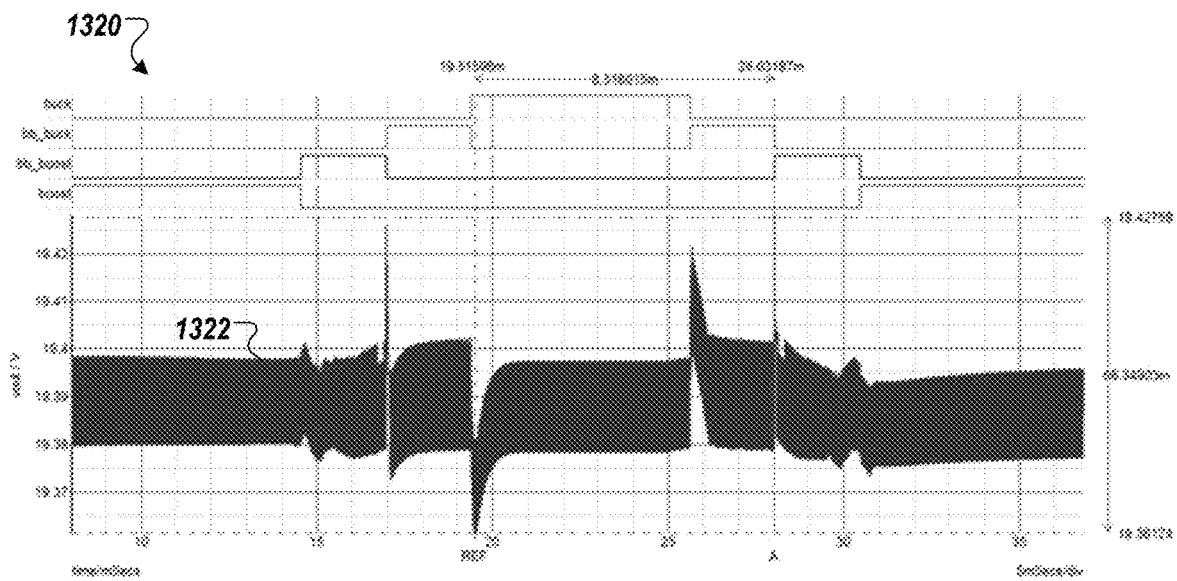
FIG. 13B is a timing diagram of an output voltage (Vout) using a slope compensation scheme that starts slope compensation from a previous cycle in at least one embodiment.

FIG. 13A is a timing diagram 1300 of an output voltage (Vout) 1302 using a first slope compensation scheme in at least one embodiment. IG. 13B is a timing diagram 1320 of an output voltage (Vout) 1322 using a slope compensation scheme that starts slope compensation from a previous cycle in at least one embodiment. As illustrated in FIG. 13A, the programmable delay Td can be programmed to convert the scheme to a conventional slope compensation scheme of having no slope compensation component added in previous cycle and start slope compensation from the beginning of next cycle. As illustrated in FIGS. 13B, slope compensation component is added from the previous cycle and shows better overshoot/undershoot in Vout 1322 as compared to Vout 1302 in FIG. 13A in DCM operation.

Figure 14A:
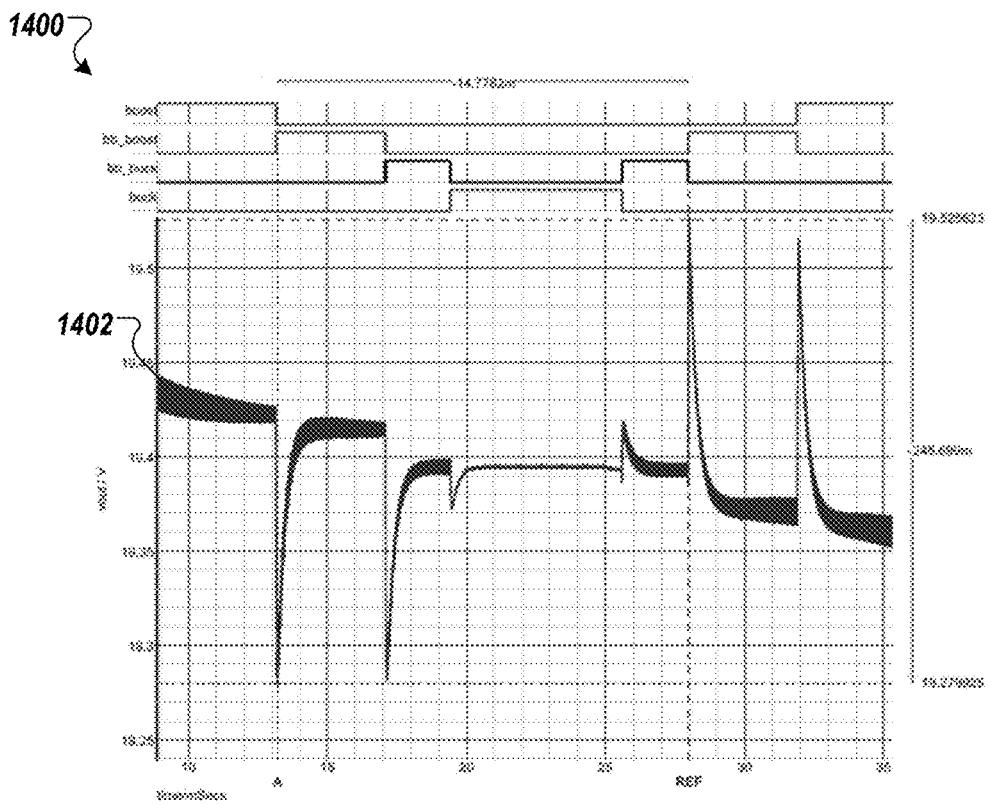
FIG. 14A is a timing diagram of an output voltage (Vout) using different programmable slope compensation percentage per mode in at least one embodiment.
Figure 14B:
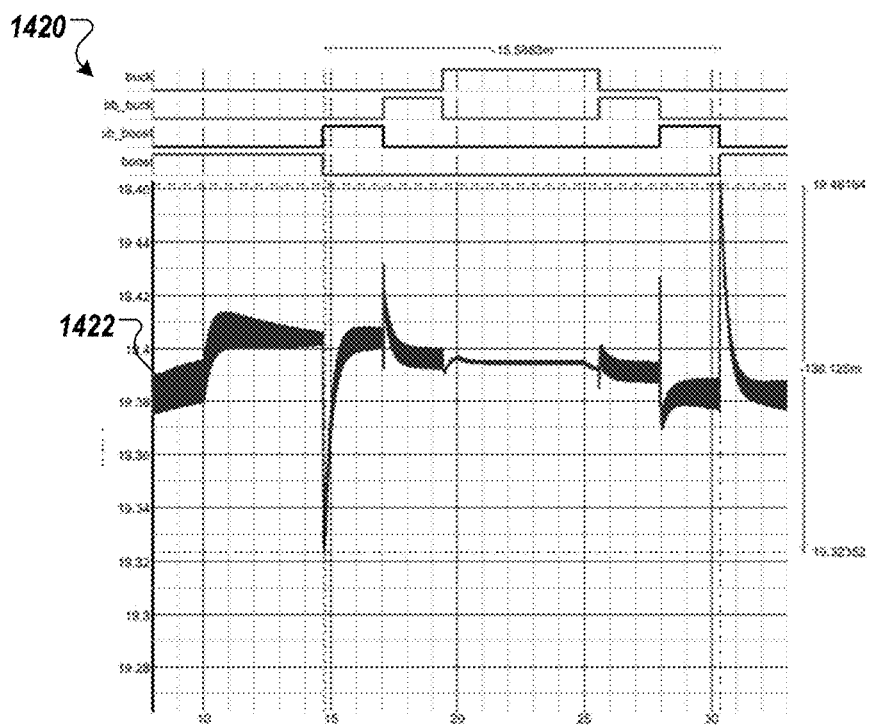
FIG. 14B is a timing diagram of an output voltage (Vout) using a programmable delay in one of the different modes of a buck-boost converter in at least one embodiment.

As described above, a slope compensation percentage is programmable on a mode basis, such as illustrated in FIGS. 14A-14B.

FIG. 14A is a timing diagram 1400 of an output voltage (Vout) 1402 using different programmable slope compensation percentage per mode in at least one embodiment. In this embodiment, a first slope compensation percentage (e.g., 80%) is programmed for a buck mode, a second slope compensation percentage (e.g., 70%) is programmed for a BB-buck mode, a third slope compensation percentage (e.g., 200%) is programmed for a boost mode, and a fourth slope compensation percentage (e.g., 150%) is programmed for a BB-boost mode. A different slope compensation percentage in every mode can be programmed to take care of mode-transition to have a lowest EA movement.

In addition, slope compensation can be programmed to have a different starting delay per each mode. With fixed or variable slope compensation percentages, the slope compensation can be added after a programmable delay in the previous cycle. This can help to provide a combination of schemes per each mode. For example, a fixed (1×) slope compensation can be enabled from a beginning of a switching cycle. This may be best suited for a buck mode and can give an advantage of much higher response time and lower ripple. The other modes can be programmed with different delays, slope compensation percentages, or both. An example of a mode with a programmable delay is illustrated in FIG. 14B.

FIG. 14B is a timing diagram 1420 of an output voltage (Vout) 1422 using a programmable delay in one of the different modes of a buck-boost converter in at least one embodiment. For example, a fixed slope compensation can be enabled with a delay of first Td (for example 50% of switching cycle) for buck and BB-buck modes and the same or different fixed slope compensation can be enabled with a delay of second Td (for example 10% of switching cycle) for boost and BB-boost modes.

In an alternate variation of same scheme which is called as delayed boost scheme, there are three modes, buck mode, buck-boost mode, and boost mode. Duty cycle changes smoothly from buck mode to buck-boost mode so there is no abrupt EA movement required. Duty cycle from buck-boost mode to boost mode needs to change from 85% to 15%, which can cause abrupt change in EA in a boost mode. In boost mode, a boost charging cycle is delayed to 70% from start of switching cycle when mode-transitions from buck-boost mode to the boost mode. As such, the slope compensation current is integrated to 85% value, which is similar to buck-boost mode. This boost starting delay keeps reducing with reduction in Vin/Vout ratio, so the required boost duty cycle is achieved as the buck-boost converter enters into a deep boost mode.

Figure 15:
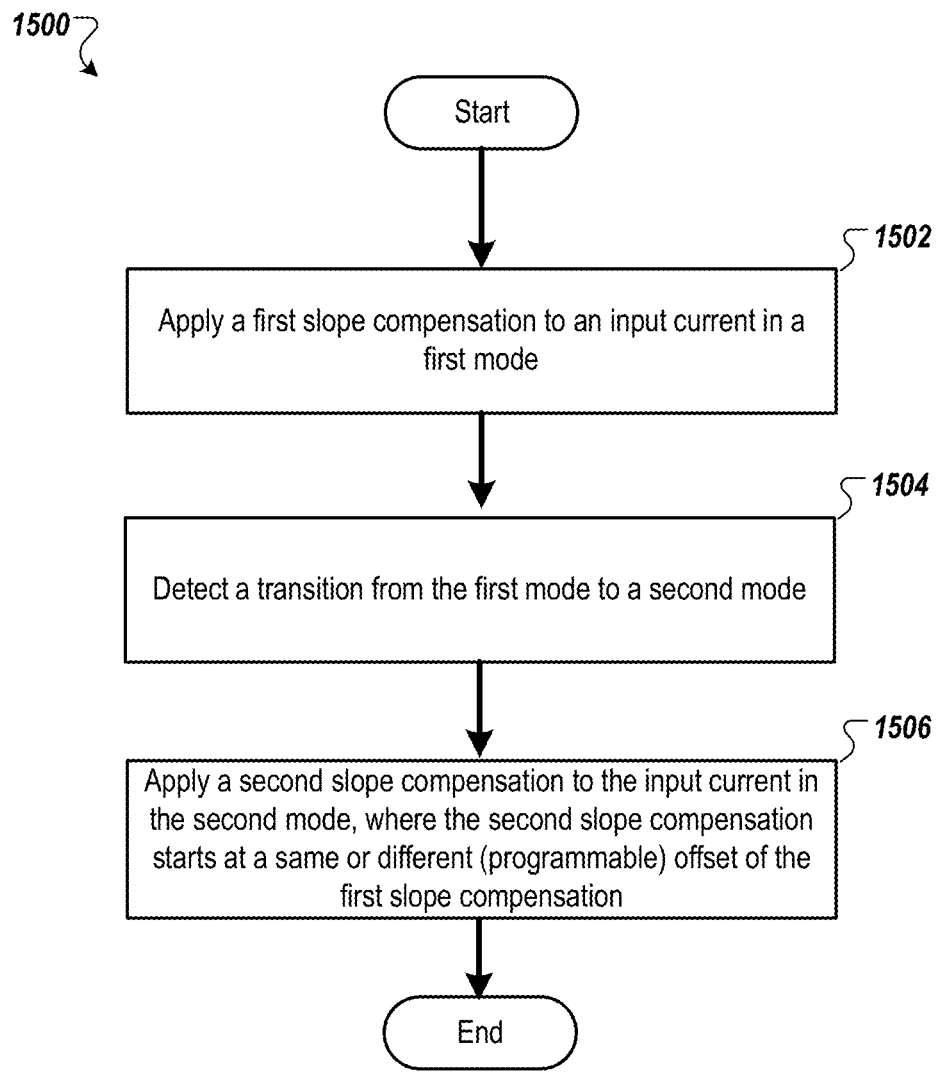
FIG. 15 is a flow diagram of a method of applying a second slope compensation that starts at a same or different (programmable) offset of a first slope compensation in at least one embodiment.

FIG. 15 is a flow diagram of a method 1500 of applying a second slope compensation that starts at a same or different (programmable) offset of a first slope compensation in at least one embodiment. Method 1500 can be performed by processing logic comprising hardware, firmware, or any combination thereof. Method 1500 can be performed by USB controller 200 of FIG. 2. In another embodiment, method 1500 can be performed by slope compensation circuit 204. In another embodiment, method 1500 can be performed by USB Type-C controller 600 of FIG. 6.

Referring back to FIG. 15, method 1500 begins by processing logic applying a first slope compensation to an input current of a buck-boost converter in a first mode in which the buck-boost converter is operating in a DCM (block 1502). The first mode has a first duty cycle. Processing logic detects a transition of the buck-boost converter from the first mode to a second mode having a second duty cycle that is less or more than the first duty cycle (block 1504). Processing logic applies a second slope compensation to the input current (block 1506) where the second slope compensation starts at a same or different (programmable) offset of the first slope compensation, and the method 1500 ends.

In a further embodiment, processing logic detects a transition from a BB-buck mode to a BB-boost mode. In this embodiment, the first slope compensation comprises a first slope percentage, and wherein the second slope compensation comprises a second slope percentage that is different than the first slope percentage.

In a further embodiment, processing logic applies a third slope compensation to the input current in a third mode. The third slope compensation includes a third slope percentage that is different than the first slope percentage and the second slope percentage. The third mode can be a buck mode or a boost or a bb-buck mode or a bb-boost mode.

In another embodiment, processing logic delays a first delay amount (or time) before applying the first slope compensation and delays a second delay amount (or time) before applying the second slope compensation, where the first delay amount and the second delay amount are different. The delay amount can be a time period, a specified time interval, a time value of a timer, or the like. In another embodiment, the first slope compensation and the second slope compensation each include a fixed slope percentage. In another embodiment, the first slope compensation and the second slope compensation include a variable slope percentage.

In another embodiment, processing logic delays by a delay amount from a start of a switching cycle before the applying the second slope compensation, the delay amount being equal to a specified percentage of the switching cycle.

The following embodiments are directed to an IC controller that includes digital control skip mode, such as described below with respect to FIGS. 16-20. It should be noted that the embodiments of the compensation circuit described above with respect to FIGS. 2, 6-7 are applicable to the embodiments of FIGS. 16-20. A buck-boost converter enters a skip mode, also referred to as a pulse-skipping mode (PSM), when power delivered in one cycle with a minimum PWM on time is higher than a load required. The buck-boost converter toggles buck boost switches for one cycle and once it enters skip mode it does not toggle any switch and wait for the exit of the skip mode before toggling switches. The frequency of the operation varies in switch mode as it skips some cycles in between entering and exiting the skip mode. A transition between CCM to DCM and vice versa requires large variation in EA output to minimize undershoot or overshoot. In skip mode, EA output goes to a very low voltage and any sudden load change requires a large EA movement, which causes large droop on Vout.

In a conventional scheme used for DCM, at the beginning of every clock cycle, switch is turned on and the inductor current (iL) builds up. This current is sensed by CSA and CSA generates an output called as CSA out. Slope compensation is the component to be added for current mode instability. CSA component and slope compensation components are added as CSA out and compared to EA output every cycle. When CSA out reaches EA level, a control signal (PWM) toggles, resetting the switch and the inductor current starts decreasing and reaches zero in DCM. There is a dead time in every cycle in DCM where the inductor current is zero and again the switch turns on in the next clock cycle and this process repeats. With the conventional scheme whenever there is mode transition from CCM-DCM or DCM-skip the movement required in EA is very high and will cause output to undershoot or overshoot in Vout, failing the USB-PD specification requirements. EA can be a very slow-moving signal due to the slope compensation component. For an inductor value, EA output voltage is an indication of the power the converter is demanding; the higher the voltage the higher the power delivery as the turn ON time increases with increase in EA output. By using the slope compensation component in off time, the same EA voltage can be maintained as offset is added to the CSA output using slope compensation. This can reduce the movement required by EA whenever there is a mode transition between CCM and DCM.

To reduce the EA movement, a scheme can be used in which the slope compensation component is altered dynamically in every cycle to reduce the movement of EA. Instead of letting the slope compensation remain idle after the PWM reset, the slope compensation can be turned on after a delay (Td) from the PWM reset. The slope compensation component moves with PWM, which helps in maintaining the same EA output voltage. As illustrated in FIG. 11, the slope compensation starts with a Td delay and adds the offset dynamically based on the time duration of the switch turn ON. Moreover, the slope compensation component that needs to be added and the delay for which the slope comp is turned off are programmable and can be used to minimize the movement of EA further.

The embodiments described below various architectures to avoid requirement of large EA movements during load based mode-transition i.e., from CCM to DCM, which can then meet +/−5% Vout and monotonicity requirements across wide range of input and output supply range. The architecture for skip mode can be implemented to ensure the buck-boost converter enters and exit from skip mode based upon output power requirement and no movement is required on an EA level.

Figure 16:
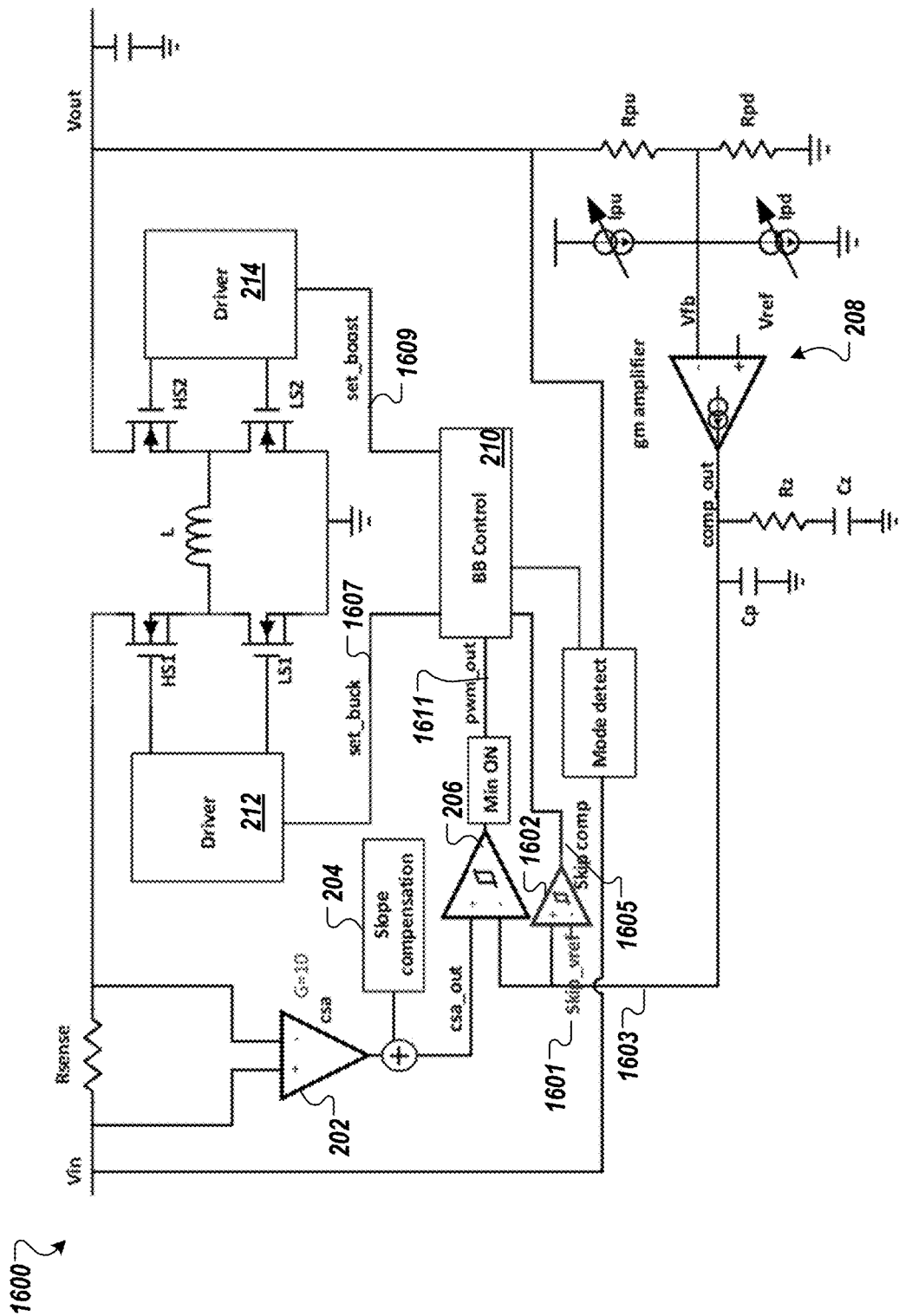
FIG. 16 is a block diagram of a USB controller with a digital control skip mode in at least one embodiment.
Figure 17:
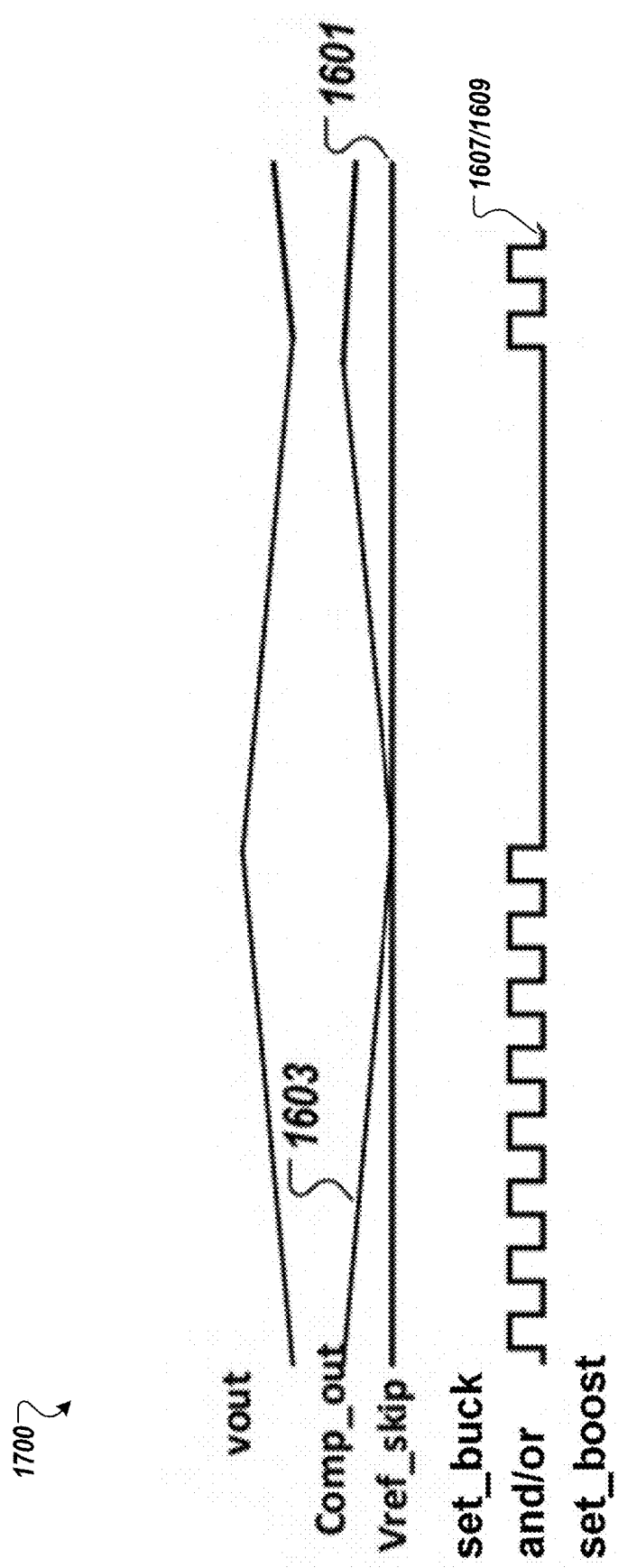
FIG. 17 is a timing diagram illustrating an analog reference based skip mode signal in at least one embodiment.

FIG. 16 is a block diagram of a USB controller 1600 with analog and digital control skip mode in at least one embodiment. USB controller 1600 is similar to USB controller 200 of FIG. 2, except the USB controller 1600 includes a skip mode comparator 1602 that receives a skip mode reference 1601 and an EA signal 1603 from EA 208. Skip mode comparator 1602 can generate a skip mode signal 1605 that is input into BB control logic 210. A skip mode can be entered and exited by the skip mode comparator 1602 comparing EA signal 1603 (comp_out) (a gm amplifier output) to skip mode reference 1601. As illustrated in a timing diagram 1700 of FIG. 17A, when EA signal 1603 (comp_out) is higher than the skip mode reference 1601 by a certain voltage, skip mode comparator 1602 output 1605 stays low and allows set_buck signal 1607 and/or set_boost signal 1609 to pass. When the EA signal 1603 is lower than skip mode reference 1601, skip mode comparator 1602 output 1605 goes high and does not allow to pass set_buck 1607 and set_boost 1609 signals. As described herein, EA signal 1603 (comp_out) is a voltage that is compared by comparator 206 to offset CSA signal 205, which includes slope compensation component.

Any buck-boost converter needs to turn ON and turn OFF the switches to maintain the duty cycle. Since turning the switch ON and OFF requires a finite amount of time, there is a minimum duty cycle and a maximum duty cycle that is achievable with the buck-boost converter. When the required duty cycle is less than the minimum possible for a buck-boost converter, it enters the skip mode where the buck-boost converter toggles with minimum duty cycle for one cycle and does not toggle for consecutive cycles effectively decreasing the frequency and hence duty cycle reaches to minimum possible achieved by the converter. When the buck-boost converter enters the skip mode it can stay in skip mode for tens of milliseconds where EA can sag to a very low level and for any load current increase, EA will take longer time to reach its previous value and can cause large undershoot at the output. Moreover, the minimum value of EA varies with the mode that is required for skip mode, which makes it much more difficult to define the skip mode properly. It can be difficult to accurately set skip mode reference 1601 for skip mode since the slope compensation offset added to CSA signal 205 is different in different mode. These components need to be accurately designed for accurately predicting skip references to enter and exit a skip mode. Offset CSA signal 205 can vary largely with different modes and can be difficult to implement skip mode using this approach.

To overcome the deficiencies described above, the PWM_OUT 1611 pulse can be digitally compared to a minimum pulse width by a BB control logic 210 for skip enter or exit. PWM_OUT 1611 pulse is generated by comparing CSA_OUT signal 205 with comp_out signal 1603 using comparator 206. If PWM_OUT 1611 pulse is of higher width than a minimum skip ON time, then a controller exits the skip mode and passes PWM_OUT 1611 signal to set_buck 1607 and/or set_boost 1609 signal depending on the mode of buck-boost. If PWM_OUT 1611 pulse is of lower width than a minimum skip ON time, which means that less power is needed to be delivered than the minimum DCM mode power, then the controller enters into the skip mode and does not pass PWM_OUT 1611 signal to set_buck 1607 and set_boost 1609 signals. The skip ON time can be programmable to support different applications and optimizing efficiency in a lower power mode. Programmable digital hysteresis can be added between skip entry and skip exit pulse width ON time thresholds to ensure there is no chattering. In this embodiment, no analog block is required to implement skip mode. As such, design complexity can be reduced. In addition, since a clock signal can be very accurate (e.g., +/−2%) and the resolution of the skip mode is decided by a clock duration (e.g., 20 ns, 40 ns, or the like), the skip mode entry and exit can be accurately predicted and controlled.

Figure 18:
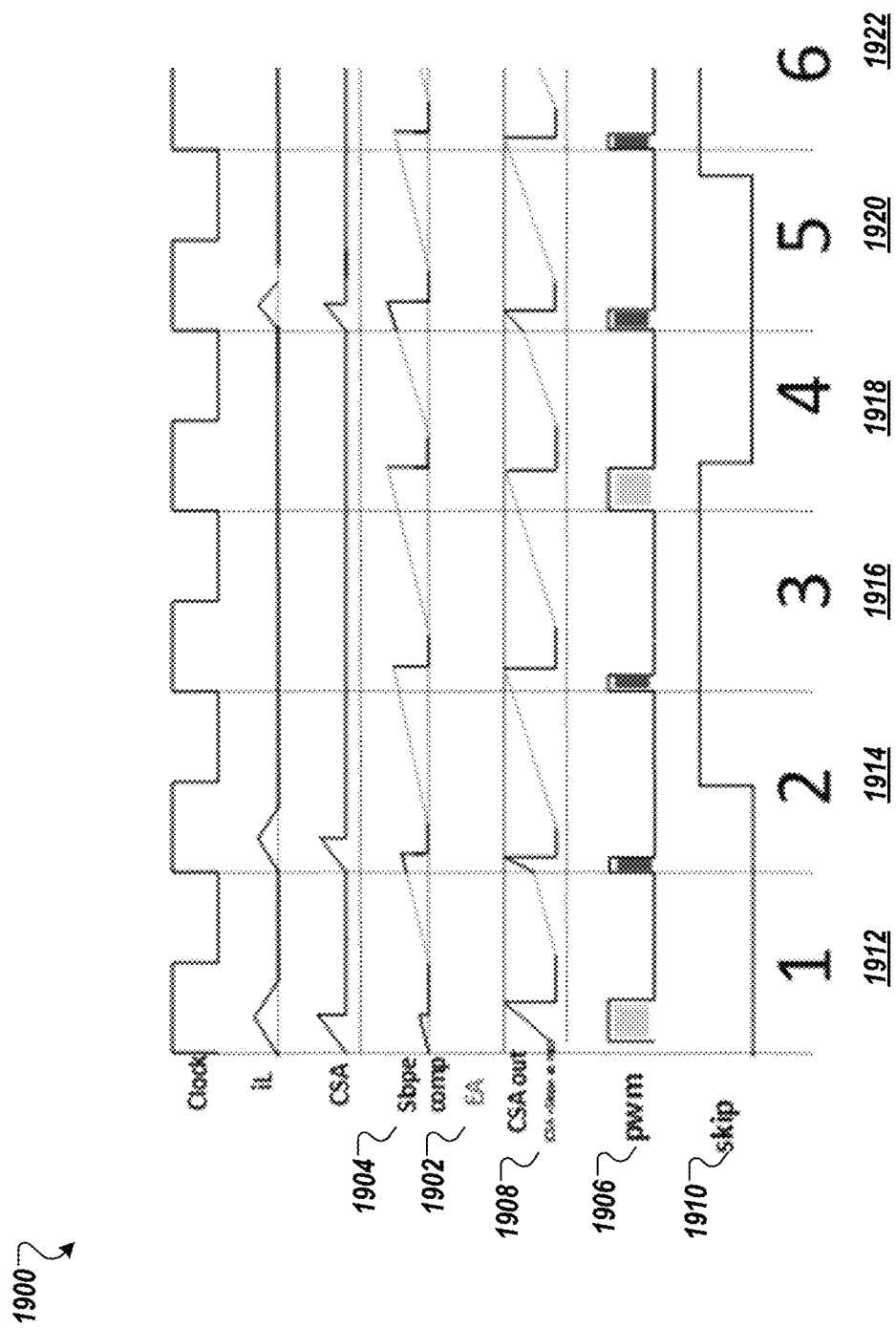
FIG. 18 is a timing diagram illustrating signals during a digitally controlled skip mode in at least one embodiment.

FIG. 18 is a timing diagram 1900 illustrating signals during a skip mode in at least one embodiment. Timing diagram 1900 shows the entry and exit of a skip mode along with the operation of a buck-boost converter. In a conventional mode, the skip mode is solely based on the absolute EA voltage as illustrated with respect to FIG. 17. EA voltage 1902 (which is the same as comp_out 1603 in FIG. 16) is a derivative version of an output voltage Vout. CSA_OUT signal 205 is compared against EA voltage 1902 to generated PWM 1906 signal. CSA_OUT signal 205 is combined signal of CSA 1908 and slope-comp 1904 signal. The width of PWM 1906 signal is digitally compared against a predefined SKIP entry width threshold, in BB-control logic 210 to decide if part should enter in SKIP mode or not. If the width of PWM 1906 signal is lesser than SKIP entry width threshold, digital SKIP 1910 signal is asserted and buck-boost converter goes into SKIP mode. Similarly, if width of PWM 1906 is more than SKIP exit width threshold, then digital SKIP 1910 signal is de-asserted and buck-boost converter comes out of SKIP mode. During Skip mode, as buck-boost converter is not giving any pulses via set_buck/set_boost signals to drivers 212 and 214, there is no inductor current (iL) and no CSA signal 1908. Hence, in SKIP mode, EA voltage 1902 is compared with a CSA_OUT signal 205 which is same as slope compensation 1904, to generate a PWM pulse 1906 even though the device enters a skip mode. A pulse width duration can be used to decide the entry and exit skip mode in this scheme. The entry and exit of skip mode is solely based on the pulse width, which encodes information of the direction of movement of Vout. When the output power requirement is less, the PWM 1906 pulse width becomes small and when the pulse width duration becomes smaller than the skip entry threshold, the buck-boost converter is controlled to enter the skip mode. In the skip mode, the EA out is compared with the slope compensation and a pulse is generated whose duration is compared with the skip exit threshold. When this pulse duration reaches the skip exit threshold, the buck-boost converter is controlled to exit the skip mode.

Figure 19:
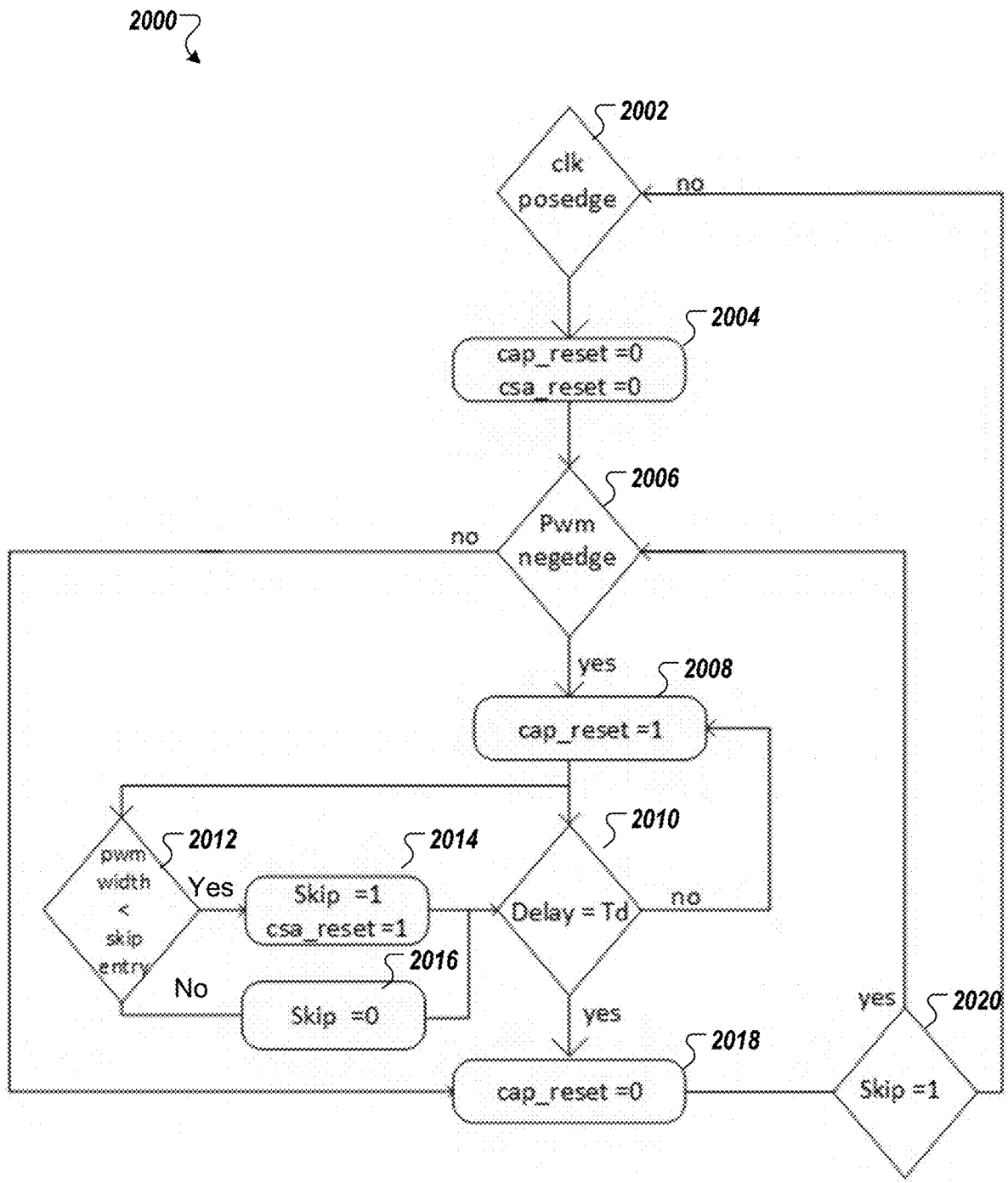
FIG. 19 is a flow diagram of a method of digitally controlling a skip mode in at least one embodiment.

As illustrated in FIG. 19, in a first cycle 1912 cycle 1, buck-boost converter is controlled to operate in DCM and the duration of PWM pulse width is higher than a skip entry threshold, so the device is operating in DCM and a skip signal 1910 is set to 0. In a second cycle 1914, cycle 2, the PWM pulse width is lower than the skip entry threshold, so a skip signal 1910 is set and the device enters the skip mode. In a third cycle 1916, cycle 3, the device is in skip mode and all switches are turned off and CSA output 1908 is 0. A slope compensation component 1904 is compared to EA voltage 1902 to generate a PWM pulse 1906. The PWM pulse width is less than the skip exit threshold and it continues in skip mode. In a fourth cycle 1918, cycle 4, the PWM pulse width is higher than a skip exit threshold and the device removes (or resets) the skip flag (skip signal 1910 is set to 0). In a fifth cycle 1920, cycle 5, the device operates in DCM and PWM pulse width is lower than the skip entry threshold and skip signal 1910 is set. In a sixth cycle 1922, the device is in skip mode and all switches are turned off and CSA output 1908 is 0. A slope compensation component 1904 is compared to EA voltage 1902 to generate a PWM pulse 1906. The PWM pulse width is less than the skip exit threshold and it continues to be in skip mode and skip signal 1910 continues to be high.

FIG. 19 is a flow diagram of a method 2000 of digitally controlling a skip mode in at least one embodiment. Method 2000 can be performed by processing logic comprising hardware, firmware, or any combination thereof. Method 2000 can be performed by USB controller 200 of FIG. 2. In another embodiment, method 2000 can be performed by slope compensation circuit 204. In another embodiment, method 2000 can be performed by USB Type-C controller 600 of FIG. 6. In another embodiment, method 2000 can be performed by BB control logic 210 of FIG. 2 and FIG. 16.

Referring back to FIG. 19, method 2000 begins at a first edge (e.g., positive edge) of a clock at block 2002 by processing logic setting a capacitor reset indicator to zero and a CSA reset indicator to zero (block 2004). Processing logic determines if a second edge (e.g., negative edge) of a PWM pulse is detected (block 2006). When the edge of the PWM pulse is detected at block 2006, processing logic sets the capacitor reset indicator to one (block 2008). Processing logic starts a programmable delay (Td) and determines whether pulse width of PWM pulse is less than a skip entry threshold at block 2012. If the pulse width is less than the skip entry threshold at block 2012, processing logic sets a skip mode indicator to one and sets the CSA reset indicator to 1 at goes to block 2010 to determine whether the programmable delay (Td) has expired. If not, processing logic returns to block 2008. If at block 2010 processing logic determines that the pulse width is not less than the skip entry, processing logic sets the skip mode indicator to zero at block 2016 and goes to block 2010 to determine whether the programmable delay (Td) has expired. Once the programmable delay (Td) has expired, processing logic goes to block 2018 to set the capacitance reset indicator to zero and goes to block 2020 where processing logic determines if the skip mode indicator is set to 1. If so, the processing logic returns to block 2006. If the skip mode indicator is not set to 1, processing logic returns to block 2020 to wait for a first edge (e.g., positive edge).

In another embodiment, instead of measuring the pulse width for one cycle to detect the skip mode, pulse widths can be averaged over multiple cycles to remove any PWM glitches. In another embodiment, the dead time after which the slope compensation starts can be programmable and can vary from cycle to cycle. In another embodiment, the slope compensation components being added during switch turn ON and turn OFF times can be different and can be changed to minimize the ripple in Vout. In another embodiment, the dead time and slope compensation components being added during switch turn ON and turn OFF times can be changed in every cycle to get a fixed offset, making it independent of any small signal noise in PWM.

In one embodiment, the mode-transition architecture can be used for any buck-boost converter in a USB-PD application. In another embodiment, the mode-transition architecture can be used for any buck-boost converter in other applications. In another embodiment, the mode-transition architecture can be used in boost converters. In another embodiment, the mode-transition architecture can be used in other power converters as well.

Embodiments of mode-transition architectures described herein can provide a simpler architecture with less design complexity. Control logic that implements the techniques described herein for mode transitions can be implemented in circuits using Register Transfer Level (RTL). Embodiments of mode-transition architectures can have a low chip area as well. Embodiments of mode-transition architectures can work seamlessly between CCM and DCM modes operation. Embodiments of mode-transition architectures can allow a lower load capacitance as the EA movement is lower and the requirement of a capacitor to support the load current during this time reduces the amount of capacitance, reduces bill of material (BOM) costs and real estate on a circuit board. In some embodiments, firmware can be used to alter a scheme in different modes of converters. Firmware can provide programmable options to tune for any mode based on customer-specific modes of operations, such as buck only modes or boost only modes and even legacy modes of operation. Firmware can provide flexibility in the IC controller's use in various applications, programmability, as well as a quick turn-around design time for implementing the IC controller in a new application. Embodiments of the digital skip mode architecture can reduce accuracy requirements of the CSA and slope compensation blocks. This also reduces design complexity by having simpler block components, lower chip area, and lower power consumption. In addition, as described herein, the digital skip mode architecture can be very accurate since the accuracy depends upon clock frequency (e.g., 24 MHz) which can easily be achieved in performance. A skip entry threshold that be digitally controlled can be programmable to achieve an optimized efficiency in a low power mode for different applications. This can provide scalability and programmability in various applications.

Figure 20:
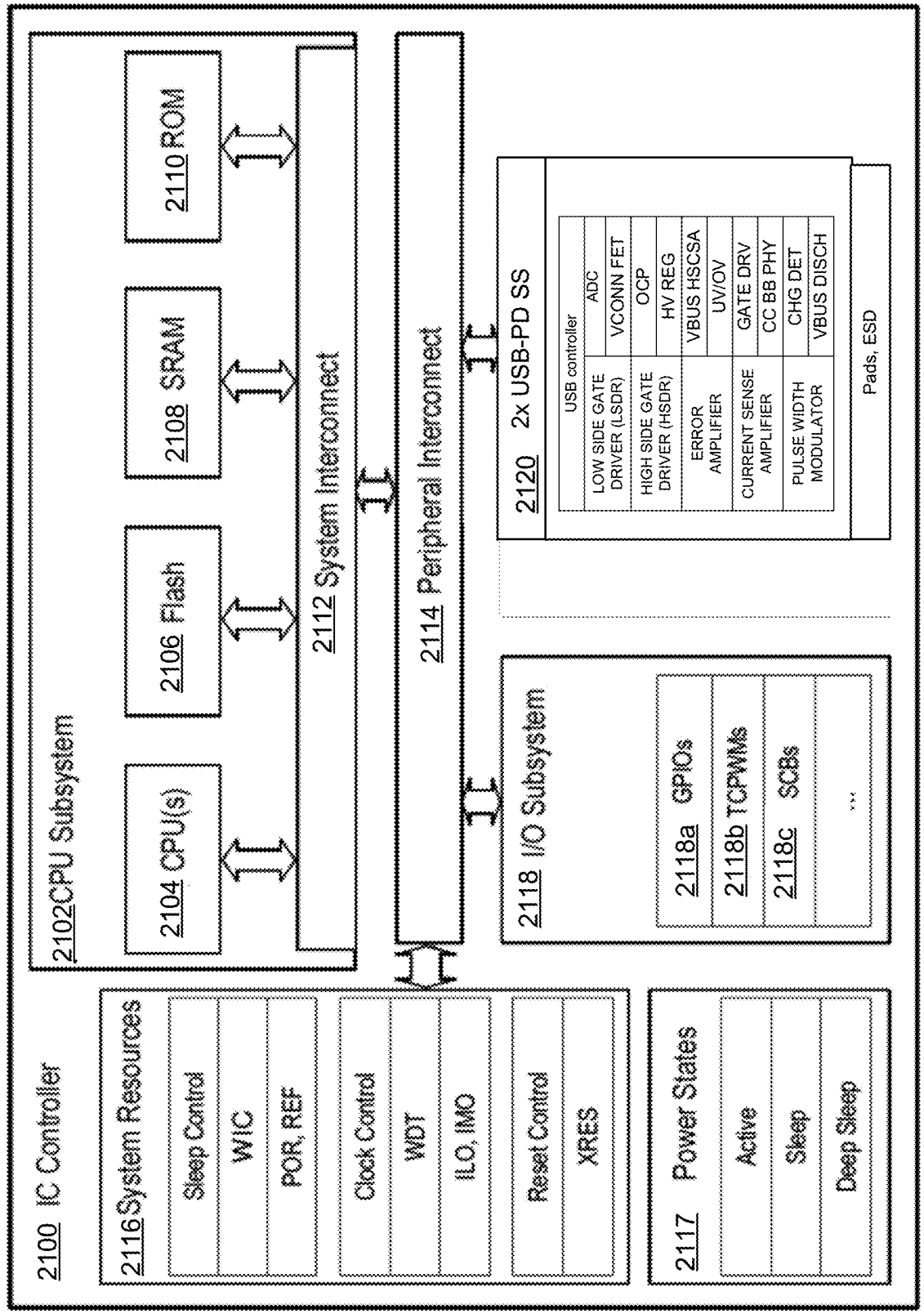
FIG. 20 is a block diagram of an on-die IC controller with a USB-PD subsystem in at least one embodiment.

FIG. 20 is a block diagram of an on-die IC controller 2100 with a USB-PD subsystem in at least one embodiment. IC controller 2100 is example semiconductor device that is configured in accordance with the USB-C mode-transition architecture described herein. In the embodiment illustrated in FIG. 20, IC controller 2100 is a single-chip IC controller manufactured on a semiconductor die. For example, IC controller 2100 may be a single-chip IC device from the family of CCGxx USB controllers developed by Cypress Semiconductor Corporation, San Jose, Calif. In another example, IC controller 2100 may be a single-chip IC that is manufactured as a System-on-Chip (SoC). In other embodiments, the IC controller 2100 may be a multi-chip module encapsulated in a single semiconductor package. Among other components, IC controller 2100 includes central processing unit (CPU) subsystem 2102, peripheral interconnect 2114, system resources 2116, input/output (I/O) subsystem 2118, USB-PD subsystem 2120, and various terminals (e.g., pins) that are configured for receiving and sending signals.

CPU subsystem 2102 includes one or more CPUs 2104, flash memory 2106, SRAM (Static Random Access Memory) 2108, and ROM (Read Only Memory) 2110 that are coupled to system interconnect 2112. CPU 2104 is a suitable processor that can operate in an IC or a SoC device. Flash memory 2106 is non-volatile memory (e.g., NAND flash, NOR flash, etc.) that is configured for storing data, programs, and/or other firmware instructions. Flash memory 2106 is tightly coupled within the CPU subsystem 2102 for improved access times. SRAM 2108 is volatile memory that is configured for storing data and firmware instructions accessed by CPU 2104. ROM 2110 is read-only memory (or other suitable storage medium) that is configured for storing boot-up routines, configuration parameters, and other firmware parameters and settings. System interconnect 2112 is a system bus (e.g., a single-level or multi-level Advanced High-Performance Bus, or AHB) that is configured as an interface that couples the various components of CPU subsystem 2102 to each other, as well as a data and control interface between the various components of the CPU subsystem and peripheral interconnect 2114.

Peripheral interconnect 2114 is a peripheral bus (e.g., a single-level or multi-level AHB) that provides the primary data and control interface between CPU subsystem 2102 and its peripherals and other resources, such as system resources 2116, I/O subsystem 2118, and USB-PD subsystem 2120. The peripheral interconnect 2114 may include various controller circuits (e.g., direct memory access, or DMA controllers), which may be programmed to transfer data between peripheral blocks without burdening the CPU subsystem 2102. In various embodiments, each of the components of the CPU subsystem and the peripheral interconnect may be different with each choice or type of CPU, system bus, and/or peripheral bus.

System resources 2116 include various electronic circuits that support the operation of IC controller 2100 in its various states and modes. For example, system resources 2116 may include a power subsystem having analog and/or digital circuits required for each controller state/mode such as, for example, sleep control circuits, wake-up interrupt controller (WIC), power-on-reset (POR), voltage and/or current reference (REF) circuits, etc. In some embodiments, the power subsystem may also include circuits that allow IC controller 2100 to draw and/or provide power from/to external sources with several different voltage and/or current levels and to support controller operation in several power states 2117 (e.g., such as active state, sleep state, and a deep sleep state with clocks turned off). Further, in some embodiments the CPU subsystem 2102 may be optimized for low-power operation with extensive clock gating and may include various internal controller circuits that allow the CPU to operate in the various power states 2117. For example, the CPU may include a wake-up interrupt controller that is configured to wake the CPU from a sleep state, thereby allowing power to be switched off when the IC chip is in the sleep state. System resources 2116 may also include a clock subsystem having analog and/or digital circuits for clock generation and clock management such as, for example, clock control circuits, watchdog timer (WDT) circuit(s), internal low-speed oscillator (ILO) circuit(s), and internal main oscillator (IMO) circuit(s), etc. System resources 2116 may also include analog and/or digital circuit blocks that provide reset control and support external reset (XRES).

In various embodiments, I/O subsystem 2118 may include various different types of I/O blocks and subsystems. For example, in the embodiment illustrated in FIG. 21, I/O subsystem 2118 includes GPIO (general purpose input output) blocks 2118a, TCPWM (timer/counter/pulse-width-modulation) blocks 2118b, and SCBs (serial communication blocks) 2118c. GPIOs 2118a include analog and/or digital circuits configured to implement various functions such as, for example, pull-ups, pull-downs, input threshold select, input and output buffer enabling/disabling, multiplex signals connected to various I/O pins, etc. TCPWMs 2118b include analog and/or digital circuits configured to implement timers, counters, pulse-width modulators, decoders and various other analog/mixed signal elements that are configured to operate on input/output signals. SCBs 2118c include analog and/or digital circuits configured to implement various serial communication interfaces such as, for example, I2C, SPI (serial peripheral interface), UART (universal asynchronous receiver/transmitter), CAN (Controller Area Network) interface, CXPI (Clock eXtension Peripheral Interface), etc.

USB-PD subsystem 2120 provides the interface to a USB Type-C port and is configured to support USB communications as well other USB functionality, such as power delivery and battery charging. USB-PD subsystem 2120 includes the electro-static discharge (ESD) protection circuits required on a Type-C port. USB-PD subsystem 2120 also includes a Type-C transceiver and physical layer logic (PHY), which are configured as an integrated baseband PHY circuit to perform various digital encoding/decoding functions (e.g., Biphase Mark Code-BMC encoding/decoding, cyclical redundancy checks-CRC, etc.) and analog signal processing functions involved in physical layer transmissions. USB-PD subsystem 2120 also provides the termination resistors (RP and RD) and their switches, as required by the USB-PD specification, to implement connection detection, plug orientation detection, and power delivery roles over a Type-C cable. IC controller 2100 (and/or the USB-PD subsystem 2120 thereof) may also be configured to respond to communications defined in a USB-PD Specification such as, for example, SOP (start-of-packet), SOP', and SOP" messaging.

Among other circuitry, USB-PD subsystem 2120 may further include: one or more analog-to-digital convertors (ADCs) for converting various analog signals to digital signals; a VCONN FET; an error amplifier (ERROR AMP) for controlling the power source voltage applied to the VBUS line per a PD contract; a high voltage regulator (HV REG) for converting the power supply voltage to the precise voltage (e.g., 3-5V) needed to IC controller 2100; a current sense amplifier (CSA) and an over-voltage protection (OVP) circuits for providing over-current (OCP) and over-voltage (OV) protection and under-voltage (UV) protection on the VBUS line with configurable thresholds and response times; a pulse width modulator (PWM); one or more gate drivers (GATE DRV) for controlling the power switches that turn ON and off the provision of power over the VBUS line; a low-side gate driver (LSDR), a high-side gate driver (HSDR) for controlling switches of the buck-boost converter; a communication channel PHY (CC BB PHY) logic for supporting communications on a Type-C Communication Channel (CC) line; a charging protocol detection block (CHG DET) to detect different type of PD chargers; and at least two on-die discharge (VBUS DISCH) circuits that can discharge a VBUS line voltage to any of range of programmable voltage levels.

Various embodiments of the USB-C mode-transition architecture described herein may include various operations. These operations may be performed and/or controlled by hardware components, digital hardware and/or firmware, and/or combinations thereof. As used herein, the term "coupled to" may mean connected directly or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An integrated circuit (IC) controller for a Universal Serial Bus (USB) Type-C device, the IC controller comprising:
 a current sense amplifier (CSA) to measure an input current of a buck-boost converter;
 a slope compensation circuit comprising a capacitor to store a charge during a first duty cycle and apply the charge during a second duty cycle, wherein the slope compensation circuit is coupled to an output of the CSA, the slope compensation circuit to add an offset to the output of the CSA when enabled; and
 a controller coupled to the slope compensation circuit, wherein the controller is operable to:
  detect a transition of the buck-boost converter from a first mode having the first duty cycle to a second mode having the second duty cycle that is less than the first duty cycle; and
  control the offset output by the slope compensation circuit to nullify an error in the output of the CSA caused by the transition.

2. The IC controller of claim 1, wherein the first mode is a buck-boost mode that follows a buck mode (BB-buck mode), and wherein, to control the slope compensation circuit, the controller is further operable to:
 cause the slope compensation circuit to store the charge in the capacitor of the slope compensation circuit during a first BB cycle; and
 cause the slope compensation circuit to apply the charge during a second BB cycle to start the second BB cycle with a higher voltage than the first BB cycle.

3. The IC controller of claim 1, wherein the first mode is a buck-boost mode that follows a boost mode (BB-boost mode), and wherein, to control the slope compensation circuit, the controller is further operable to:
 disable the slope compensation circuit during a first BB cycle; and
 enable the slope compensation circuit during a second BB cycle that follows the first BB cycle.

4. The IC controller of claim 1, wherein the first mode is a buck-boost mode that follows a buck mode (BB-buck mode), and wherein, to control the slope compensation circuit, the controller is further operable to:
 measure an output voltage (Vout) of the buck-boost converter;
 measure an input voltage (Vin) of the buck-boost converter; and
 determine that the Vin meets or exceeds a first threshold associated with Vin approaching Vout.

5. The IC controller of claim 1, wherein the first mode is a buck-boost mode that follows a boost mode (BB-boost mode), and wherein, to control the slope compensation circuit, the controller is further operable to:
 measure an output voltage (Vout) of the buck-boost converter;
 measure an input voltage (Vin) of the buck-boost converter; and
 determine that the Vout meets or exceeds a second threshold associated with Vout approaching Vin.

6. The IC controller of claim 1, wherein the slope compensation circuit comprises:
 a current source;
 a first switch coupled to an output of the current source;
 the capacitor coupled to an output node and the output of the CSA; and
 a second switch coupled between the output node and the output of the CSA.

7. The IC controller of claim 1, wherein an output voltage (Vout) of the buck-boost converter is in a range of approximately 3.3V to 21.5V, wherein an input supply range is in a range of approximately 5V to 24V, and wherein the IC controller is operable to maintain the output voltage (Vout)

within a specified percentage range during a change in an input voltage (Vin) from a first voltage to a second voltage.

8. The IC controller of claim 1, wherein the controller comprises a hardware state machine to detect the transition from the first mode to the second mode and send one or more control signals to the slope compensation circuit to control the slope compensation circuit to nullify the error in the output caused by the transition.

9. A Universal Serial Bus (USB) device comprising:
a buck-boost converter comprising an input terminal and an output terminal;
a USB Type-C connector comprising a VBUS line; and
an integrated circuit (IC) controller comprising:
 a VBUS terminal coupled to the VBUS line of the USB Type-C connector and the output terminal of the buck-boost converter;
 a current sense amplifier (CSA) to measure an input current at the input terminal;
 a slope compensation circuit comprising a capacitor to store a charge during a first duty cycle and apply the charge during a second duty cycle, wherein the slope compensation circuit is coupled to an output of the CSA, the slope compensation circuit to add an offset to the output of the CSA when enabled; and
 a controller coupled to the slope compensation circuit, wherein the controller is operable to:
  detect a transition of the buck-boost converter from a first mode having the first duty cycle to a second mode having the second duty cycle that is less than the first duty cycle; and
  control the offset output by the slope compensation circuit to nullify an error in the output of the CSA caused by the transition.

10. The USB device of claim 9, wherein the first mode is a buck-boost mode that follows a buck mode (BB-buck mode), and wherein, to control the slope compensation circuit, the controller is further operable to:
 cause the slope compensation circuit to store the charge in the capacitor of the slope compensation circuit during a first BB cycle; and
 cause the slope compensation circuit to apply the charge during a second BB cycle to start the second BB cycle with a higher voltage than the first BB cycle.

11. The USB device of claim 9, wherein the first mode is a buck-boost mode that follows a boost mode (BB-boost mode), and wherein, to control the slope compensation circuit, the controller is further operable to:
 disable the slope compensation circuit during a first BB cycle; and
 enable the slope compensation circuit during a second BB cycle that follows the first BB cycle.

12. The USB device of claim 9, wherein the first mode is a buck-boost mode that follows a buck mode (BB-buck mode), and wherein, to control the slope compensation circuit, the controller is further operable to:
 measure an output voltage (Vout) of the buck-boost converter;
 measure an input voltage (Vin) of the buck-boost converter; and
 determine that the Vin meets or exceeds a first threshold associated with Vin approaching Vout.

13. The USB device of claim 9, wherein the first mode is a buck-boost mode that follows a boost mode (BB-boost mode), and wherein, to control the slope compensation circuit, the controller is further operable to:
 measure an output voltage (Vout) of the buck-boost converter;
 measure an input voltage (Vin) of the buck-boost converter; and
 determine that the Vout meets or exceeds a second threshold associated with Vout approaching Vin.

14. The USB device of claim 9, wherein the slope compensation circuit comprises:
 a current source;
 a first switch coupled to an output of the current source;
 the capacitor coupled to an output node and the output of the CSA; and
 a second switch coupled between the output node and the output of the CSA.

15. The USB device of claim 9, wherein the controller comprises a hardware state machine to detect the transition from the first mode to the second mode and send one or more control signals to the slope compensation circuit to control the slope compensation circuit to nullify the error in the output caused by the transition, wherein an output voltage (Vout) of the buck-boost converter is in a range of approximately 3.3V to 21.5V, wherein an input supply range is in a range of approximately 5V to 24V, and wherein the IC controller is operable to maintain Vout within a specified percentage range during a change in an input voltage (Vin) from a first voltage to a second voltage.

* * * * *